United States Patent
Sato et al.

(10) Patent No.: US 7,940,827 B2
(45) Date of Patent: May 10, 2011

(54) VERTICAL-CAVITY, SURFACE-EMISSION TYPE LASER DIODE AND FABRICATION PROCESS THEREOF

(75) Inventors: Shunichi Sato, Miyagi (JP); Takashi Takahashi, Miyagi (JP); Naoto Jikutani, Kanagawa (JP); Morimasa Kaminishi, Miyagi (JP); Akihiro Itoh, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 42 days.

(21) Appl. No.: 12/393,701

(22) Filed: Feb. 26, 2009

(65) Prior Publication Data

US 2009/0168828 A1    Jul. 2, 2009

Related U.S. Application Data

(60) Continuation of application No. 11/827,818, filed on Jul. 13, 2007, now Pat. No. 7,519,095, which is a continuation of application No. 11/338,220, filed on Jan. 23, 2006, now Pat. No. 7,260,137, which is a continuation of application No. 10/677,065, filed on Oct. 1, 2003, now Pat. No. 7,022,539, which is a division of application No. 09/957,507, filed on Sep. 20, 2001, now Pat. No. 6,674,785.

(30) Foreign Application Priority Data

Sep. 21, 2000  (JP) ................. 2000-286477
Mar. 12, 2001  (JP) ................. 2001-068588
Jul. 16, 2001  (JP) ................. 2001-214930

(51) Int. Cl.
    *H01S 5/00*    (2006.01)

(52) U.S. Cl. .............. 372/50.11; 372/50.124; 372/43.01
(58) Field of Classification Search ............ 372/50.11, 372/50.124
    See application file for complete search history.

(56) References Cited

U.S. PATENT DOCUMENTS

| 5,544,193 A | 8/1996 | Devaud-Pledran et al. |
| 5,734,671 A | 3/1998 | Katsuyama et al. |
| 5,903,586 A | 5/1999 | Ramdani et al. |
| 6,026,108 A | 2/2000 | Lim et al. |
| 6,061,380 A | 5/2000 | Jiang et al. |
| 6,072,196 A | 6/2000 | Sato |
| 6,207,973 B1 | 3/2001 | Sato et al. |
| 6,281,518 B1 | 8/2001 | Sato |

(Continued)

FOREIGN PATENT DOCUMENTS

JP    6-37355    2/1994

(Continued)

OTHER PUBLICATIONS

Masahiko Kondow et al., "GaInNas: A Novel Material for Wavelength-Range Laser Diodes With Excellent High-Temperature Performance", Jpn. J. Appl. Phys, Part 1, No. 28, Feb. 1996, pp. 1273-1275.

(Continued)

*Primary Examiner* — Dung T Nguyen
(74) *Attorney, Agent, or Firm* — Cooper & Dunham LLP

(57) ABSTRACT

A vertical-cavity, surface-emission-type laser diode includes an optical cavity formed of an active region sandwiched by upper and lower reflectors, wherein the lower reflector is formed of a distributed Bragg reflector and a non-optical recombination elimination layer is provided between an active layer in the active region and the lower reflector.

6 Claims, 14 Drawing Sheets

U.S. PATENT DOCUMENTS

| | | |
|---|---|---|
| 6,452,215 B1 | 9/2002 | Sato |
| 6,489,175 B1 | 12/2002 | Lee et al. |
| 6,542,528 B1 | 4/2003 | Sato et al. |
| 6,563,851 B1 | 5/2003 | Jikutani et al. |
| 6,580,741 B2 * | 6/2003 | Jiang et al. ............ 372/50.11 |
| 6,614,821 B1 | 9/2003 | Jikutani et al. |
| 6,657,233 B2 | 12/2003 | Sato et al. |
| 6,674,785 B2 | 1/2004 | Sato et al. |
| 6,756,325 B2 | 6/2004 | Bour et al. |
| 6,856,631 B1 | 2/2005 | Takahashi |
| 6,884,291 B1 | 4/2005 | Jikutani et al. |
| 7,022,539 B2 | 4/2006 | Sato et al. |
| 7,260,137 B2 | 8/2007 | Sato et al. |
| 7,330,494 B1 * | 2/2008 | Jewell et al. ............ 372/50.124 |
| 2002/0074631 A1 | 6/2002 | Sato et al. |
| 2003/0157739 A1 | 8/2003 | Jiang et al. |
| 2003/0219917 A1 | 11/2003 | Johnson et al. |
| 2004/0065888 A1 | 4/2004 | Sato et al. |
| 2005/0106766 A1 | 5/2005 | Kim et al. |
| 2005/0142683 A1 | 6/2005 | Johnson et al. |
| 2005/0202614 A1 | 9/2005 | Spruytte et al. |
| 2006/0134817 A1 | 6/2006 | Sato et al. |
| 2007/0263689 A1 | 11/2007 | Sato et al. |

FOREIGN PATENT DOCUMENTS

| | | |
|---|---|---|
| JP | 7240506 | 9/1995 |
| JP | 7-307525 | 11/1995 |
| JP | 7307525 | 11/1995 |
| JP | 8-78771 | 3/1996 |
| JP | 8340146 | 12/1996 |
| JP | 10126004 | 5/1998 |
| JP | 10-190128 | 7/1998 |
| JP | 10-233557 | 9/1998 |
| JP | 10303515 | 11/1998 |
| JP | 11-4040 | 1/1999 |
| JP | 5-90695 | 4/1999 |
| JP | 11145560 | 5/1999 |
| JP | 20004068 | 1/2000 |

OTHER PUBLICATIONS

M. Kawaguchi et al., "Low Threshold Current Density Operation of GaInNas Quantum Well Lasers Grown By Metalorganic Chemical Vapoour Deposition", Electronics Letter, Oct. 12, 2000, vol. 36, No. 21, pp. 1776-1777.

Feb. 9, 2010 Japanese official action in connection with counterpart Japanese patent application No. 2001-284632.

Aug. 31, 2010 Japanese official action in connection with counterpart Japanese patent application.

* cited by examiner

OPTICAL OUTPUT

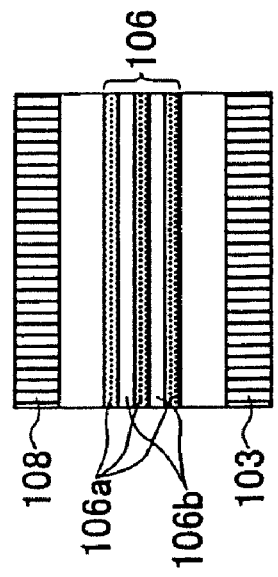
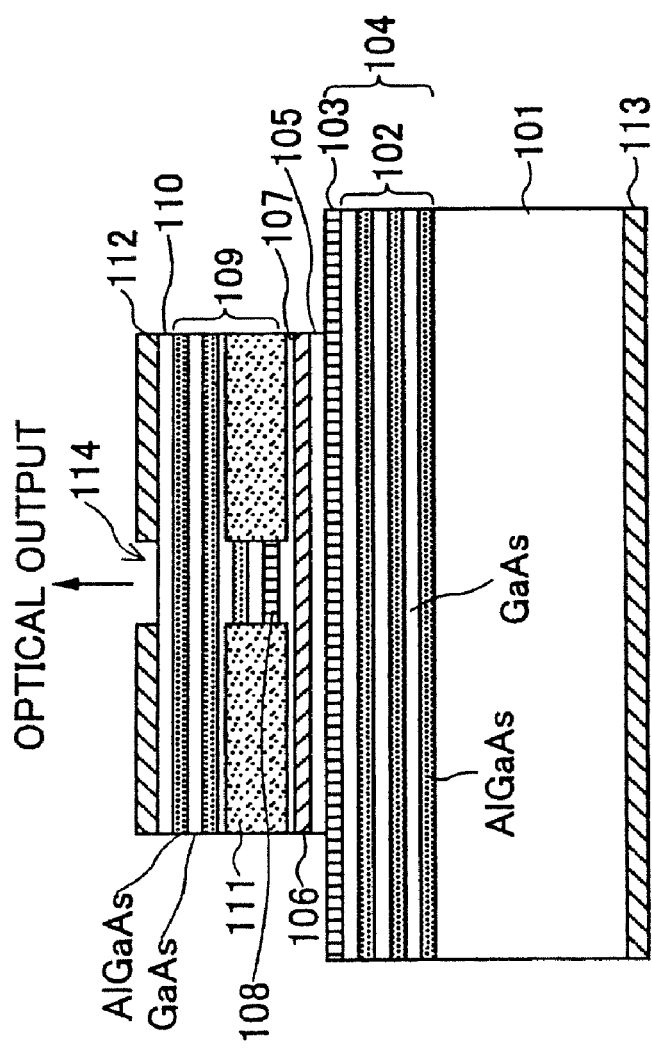

VERTICAL-CAVITY, SURFACE-EMISSION TYPE LASER DIODE AND FABRICATION PROCESS THEREOF

CROSS-REFERENCE TO RELATED APPLICATION

This application is a Rule 1.53(b) continuation of Ser. No. 11/827,818, filed Jul. 13, 2007 now U.S. Pat. No. 7,159,095, which in turn is a continuation and claims priority of Ser. No. 11/338,220, Jan. 23, 2006, now U.S. Pat. No. 7,260,137, which in turn is a continuation and claims priority of Ser. No. 10/677,065, filed Oct. 1, 2003, now U.S. Pat. No. 7,022,539, which in turn is a divisional of Ser. No. 09/957,507, filed Sep. 20, 2001, now U.S. Pat. No. 6,674,785, the entire contents of each of which are incorporated herein by reference.

BACKGROUND

This disclosure is related to a vertical-cavity, surface-emission-type laser diode and the process of making the same. Further, the present invention relates to a vertical-cavity, surface-emission-type laser-diode array, an optical transmission module, an optical transceiver module and also an optical telecommunication system.

Vertical-cavity, surface-emission-type laser diode is a laser diode that emits an optical beam in a vertical direction to a substrate. It is used for a light source of optical interconnection systems and optical pickup devices, and the like.

A vertical-cavity, surface-emission-type laser diode has an active region including an active layer that produces a laser beam. The active region is sandwiched with a pair of reflectors, wherein a semiconductor distributed Bragg reflector, in which a low-refractive index layer and a high refractive index layer are laminated alternately, is used widely for the reflectors. Materials having a wider bandgap than the active layer and not causing absorption of the optical beam coming from an active layer are used for the semiconductor distributed Bragg reflector. Particularly, the materials that achieve a lattice matching with the substrate are used so as to avoid lattice relaxation.

Meanwhile, the reflector has to have a high reflectance of 99% or more. Generally, the reflectance of the reflector becomes higher by increasing the number of stacking. However, production of the vertical-cavity, surface-emission-type laser diode becomes difficult when the number of stacking in the reflectors is increased excessively. Because of this, it is preferable that there exists a large refractive index difference between the low-refractive index layer and the high refractive index layer constituting the semiconductor distributed Bragg reflectors. AlAs and GaAs are end-member compositions of the system AlGaAs having a lattice constant almost the same as that of GaAs. Further, the materials of this system can provide a large refractive index difference therebetween. Because of this reason, it is possible to achieve a high reflectance with fewer number of stacking by using the material of the AlGaAs system.

Thus, the material of the AlGaAs system is used widely.

However, the material containing Al is very reactive, and crystal defects, originating from Al, are formed easily. For example, oxygen molecules or water molecules contained in the source material or growth atmosphere are easily incorporated into the crystal as a result of reaction with Al. Once they are thus incorporated, they form a crystal defect acting as non-optical recombination center, resulting in degradation of efficacy of optical emission. Further, there is a concern that the reliability of the device may be degraded due to the existence of such crystal defects.

Even when the active region is formed by a layer not containing Al, the problem of non-optical recombination still occurs when Al is contained in the low-refractive index layer (formed of a widegap layer) of the reflector that makes a contact with the active region. More specifically, such a non-optical recombination may occur at the interface between the active region and the reflector when carriers are injected for recombination. Thereby, the efficacy of optical emission falls off inevitably. In order to avoid this adversary influence, it is necessary to carry out rigorous process control, material purity control, optimization of growth condition, and the like. Still, it is not easy to produce a device with high quality.

Meanwhile, there are proposals in Japanese Laid-Open Patent Applications 08-340146 and 07-307525 to form a semiconductor distributed Bragg reflector by using GaInP and GaAs, which are free from Al. However, the difference of refractive index between GaInP and GaAs is only one-half the refractive index difference between AlAs and GaAs. Because of this, the number of stacking in the reflector has to be increased significantly, and the production of the laser diode becomes difficult. Associated with this there arise various problems such as degradation of yield, increased device resistance, increased time needed for producing a laser diode. Further, because of the increase of total thickness, there appears a difficulty in providing electric interconnection in such a laser diode.

Meanwhile, it is practiced to use a current confinement structure in the art of laser diode for reducing the threshold of laser oscillation. Japanese Laid-Open Patent Application 7-240506 discloses a structure that uses a current confinement structure including a high resistance layer formed by an ion implantation process in combination with a semiconductor distributed Bragg reflector that consists of AlAs/GaAs. Further, Japanese Patent 2,917,971 proposes a vertical-cavity, surface-emission-type laser diode that uses, in addition to an optical cavity formed by the semiconductor distributed Bragg reflectors of the AlGaAs/GaAs stacked structure, a current confinement structure that includes an oxide film formed by selective oxidization of a part of the Al(Ga)As optical cavity structure. In this proposal, the oxidation is conducted by supplying water vapor of high temperature. It should be noted that the oxidation process using water vapor of high temperature is capable of forming a true insulator of $Al_xO_y$. According to such an approach, the distance between the active layer and the current confinement layer can controlled exactly by controlling the process of crystal growth. Further, it is possible narrow the current path significantly. In view of these, the foregoing construction is suited for reducing reactive current and for reducing the active region. Because of this, it is also suited to for reducing electric power consumption. Thus, the construction is used widely recently.

It should be noted that the foregoing Japanese Patent 2,917,971 uses the phenomenon that the oxidation rate starts to increase sharply as the Al content in the AlGaAs layer is increased. Thus, in order to ensure that only the part to be oxidized is oxidized, the foregoing process increases the Al content of the layer in which the oxidation is to be caused. In this way, it is possible to obtain a current confinement structure by a selective oxidation process. In view of this, the Al content of the AlGaAs layer forming the low-refractive index layer of the semiconductor distributed Bragg reflector is set smaller (Ga content is increased) than the Al content of the Al(Ga)As/GaAs oxidation layer. The composition of $Al_xGa_{1-x}As$ (x=0.97) is used for the selectively oxidized layer in the foregoing Japanese Patent 2,917,971, while a composition of $Al_xGa_{1-x}As$ (x=0.92) is used for the low-refractive index layer of the semiconductor distributed Bragg reflector.

In the art of forming a current confinement structure by such a selective oxidation process, an approach is adopted to oxidize an AlAs layer from a sidewall surface thereof. In order that such a process is to be conducted, it is necessary to remove unnecessary layers by means of a mesa etching process such that the sidewall surface of the AlAs layer to be oxidized is exposed. However, in view of variation in the etching rate, there may be caused variation of mesa height within a lot. Further, there may be caused a lot-to-lot variation of mesa height. When such a variation has been caused, the device characteristic may be scattered correspondingly.

Current optical-fiber telecommunication technology uses a laser diode of long wavelength band of 1.3 μm or 1.55 μm for utilizing the wavelength slot of quartz optical fibers in which the optical loss is minimum. The optical fiber telecommunication system is spreading rapidly and it is expected that it may reach a subscriber terminal (Fiber To The Home; FTTH) in a near future. Furthermore, the technology of information transmission by way of optical signals is going to be introduced even to a device-to-device interconnection system inside an apparatus or even to an interconnection system inside a device. Like this, the technology of information transmission will become important still more. In order to realize such an optical interconnection system, it is essential to realize an optical telecommunication module of unprecedented low-cost. Thus, there is a keen demand for a small, long wavelength-band laser diode of low electric power consumption, with excellent temperature characteristics, capable of eliminating the need of a cooling system.

Currently, the material of GaInPAs system formed on an InP substrate, which is a group III-V semiconductor material, monopolizes the market. It should be noted that the material of the GaInPAs system can be tuned to the foregoing wavelength band. However, the material of the InP system has a drawback, because of the small discontinuity in the conduction band between the cladding layer (spacer layer) and the active layer, in that the electrons injected into the active layer are poorly confined, particularly when temperature of the device is increased. This results in a decrease of efficiency. Further, the materials that achieve lattice matching with an InP substrate cannot provide large refractive index difference suitable for realizing a semiconductor distributed Bragg reflector. As a result, the vertical-cavity, surface-emission-type laser diode of the long wavelength having a performance suitable for practical use has not been obtained.

The material of the GaInNAs system formed on a GaAs substrate is proposed in the Japanese Laid-Open Patent Application No. 6-37355, as the material that can settle the foregoing problems. It should be noted that GaInNAs is a group III-V mixed crystal containing N in addition to other group V element. In the system of GaInNAs, it is possible to achieve lattice matching with a GaAs substrate by adding N to GaInAs having a lattice constant larger than that of GaAs. By doing so, the bandgap energy is reduced also. Thus, it becomes possible to realize optical emission at the wavelength band of 1.3 μm or 1.5 μm. Kondou, et al., calculated the band lineup of this system in the article, Jpn. J. Appl. Phys. Vol. 35 (1996), pp. 1273-1275. As this is a material that can achieve lattice matching with GaAs, a large band discontinuity can be realized by using AlGaAs for the cladding layer. Because of this, there is an expectation that a laser diode having a high characteristic temperature may be realized by using such a material. Further, it should be noted that the material of GaInNAs can be formed on a GaAs substrate. Thus, it becomes possible to construct a/the semiconductor multilayer reflector by using an Al(Ga)As/GaAs material system. Thereby, it becomes possible to reduce the number of stacking in the multilayer reflector significantly as compared with the case of forming the multilayer reflector on the InP substrate. Further, it becomes possible to form an AlAs selective-oxidation layer as the current confinement structure, and the operating current is reduced effectively.

However, the problem noted above arises in the case the material system of Al(Ga)As/GaAs is used for the semiconductor multilayer reflector, as proposed in the Japanese Laid-Open Patent Application 10-303515 or Japanese Laid-Open Patent Application 11-145560. Further, the problem similar to above arises also in the case an AlAs selective-oxidation layer is used for the current confinement structure.

SUMMARY OF THE INVENTION

In an aspect of this disclosure, there is provided a novel and useful vertical-cavity, surface-emission-type laser diode and the process of making the same.

In another aspect of this disclosure, there is provided a vertical-cavity, surface-emission-type laser diode having excellent reliability and easily fabricated, without increasing the total thickness thereof.

In another aspect of this disclosure, there is provided a vertical-cavity, surface-emission-type laser-diode array, an optical transmission module, an optical transceiver module, and an optical telecommunication system.

In another aspect of this disclosure, there is provided a vertical-cavity, surface-emission-type laser diode having an optical cavity structure on or above a semiconductor substrate, the optical-cavity structure comprising an active region containing at least one active layer that produces a laser beam, and upper and lower reflectors sandwiching the active region to form the optical cavity, the lower reflector including a semiconductor distributed Bragg reflector having a refractive index that changes periodically, the lower reflector reflecting an optical beam incident thereto by diffraction, the semiconductor distributed Bragg reflector comprising a low-refractive-index layer of $Al_xGa_{1-x}As$ ($0<x\leq1$) and a high-refractive-index layer of $Al_yGa_{1-y}As$ ($0\leq y\leq x<1$), wherein a non-optical recombination elimination layer is provided between the active layer and the lower reflect.

In the above-mentioned structure, a non-optical recombination elimination layer is provided between the active layer and the lower reflector in the construction in which the active region (an active layer is included), in which injection of carriers is made, is sandwiched by the upper and lower reflectors. Thus, the phenomenon that the crystal defects that originate from Al crawl up to the active layer at the time of crystal growth is effectively restrained, even in the case the lower reflector is formed of a semiconductor distributed Bragg reflector including a semiconductor layer that contains Al. Thereby, the adversary effect caused by the defects is suppressed, and the active layer can be formed with high crystal quality. Accordingly, non-optical recombination caused by the crystal defects that originate from Al is reduced, and the efficiency of optical emission and the reliability of the laser diode are improved. As compared with the case in which the low-refractive index layers of the semiconductor distributed Bragg reflector are all formed of $Ga_xIn_{1-x}P_yAs_{1-y}$ ($0<x\leq1$, $0<y\leq1$), the semiconductor distributed Bragg reflector of the present invention can maintain a large refractive index difference. It should be noted that the reflector of the present invention is formed mostly of the material of the AlGaAs system. Thus, a reflectance is achieved for the reflectors with fewer number of stacking. Because of this, it is possible to obtain the high reflectance without increasing the number of stacking of in the reflector or increasing the total thickness of the device. In the laser diode of the present invention, the total thickness of the vertical-cavity, surface-emission-type laser diode does not increase, and the operating current is small. Further, the laser diode has excellent reliability. As such, the vertical-cavity, surface-emission-type laser diode can be produced easily.

In another aspect of this disclosure, there is provided a vertical-cavity, surface-emission-type laser diode having an optical cavity on or above a semiconductor substrate, the optical cavity comprising an active region containing at least one active layer that produces a laser beam, and upper and lower reflectors sandwiching the active region to form the optical cavity, each of the upper and lower reflectors including a semiconductor distributed Bragg reflector in which a refractive index is changed periodically, the upper and lower reflectors reflecting an optical beam incident thereto, the semiconductor distributed Bragg reflector comprising a low-refractive-index layer of $Al_xGa_{1-x}As$ ($0<x\leq1$) and a high-refractive-index layer of $Al_yGa_{1-y}As$ ($0\leq x\leq1$), wherein a non-optical recombination elimination layer is provided between the active layer and the lower reflector and a non-optical recombination elimination layer is provided between the active layer and the upper reflector.

According to the above-mentioned optical cavity, a non-optical recombination elimination layer is provided between the active layer and each of the lower and upper reflectors in the construction in which the active region (an active layer is included), in which injection of carriers is made, is sandwiched by the upper and lower reflectors. Thus, the phenomenon that the crystal defects that originate from Al crawl up to the active layer at the time of crystal growth is effectively restrained, even in the case the lower reflector is formed of a semiconductor distributed Bragg reflector including a semiconductor layer that contains Al. Particularly, the active region, in which carrier injection occurs, is sandwiched by the non-optical recombination at both top part and bottom part thereof. Thereby, non-optical recombination caused by the crystal defects that originate from Al is reduced particularly effectively, and the efficiency of optical emission and the reliability of the laser diode are improved easily. While the effect of the non-optical recombination elimination layer is obtained when it is inserted to one of the reflectors, the construction in which the non-optical recombination elimination layer is provided to each of the reflectors is extremely effective for eliminating the influence of the Al defects. As compared with the case in which the low-refractive index layers of the semiconductor distributed Bragg reflector are all formed of $Ga_xIn_{1-x}P_yAs_{1-y}$ ($0<x\leq1$, $0<y\leq1$), the semiconductor distributed Bragg reflector of the present invention can maintain a large refractive index difference. It should be noted that the reflector of the present invention is formed mostly of the material of the AlGaAs system. Thus, a reflectance is achieved for the reflectors with fewer number of stacking. Because of this, it is possible to obtain the high reflectance without increasing the number of stacking of in the reflector or increasing the total thickness of the device. In the laser diode of the present invention, the total thickness of the vertical-cavity, surface-emission-type laser diode does not increase, and the operating current is small. Further, the laser diode has excellent reliability. As such, the vertical-cavity, surface-emission-type laser diode can be produced easily.

By using $Ga_xIn_{1-x}PyAs1-y$ ($0<x\leq1$, $0<y\leq1$) for the non-optical recombination elimination layer in combination with a GaAs substrate, the carriers that cause a leak to the layer containing Al through the $Ga_xIn_{1-x}P_yAs_{1-y}$ ($0<x\leq1$, $0<y\leq1$) is eliminated substantially particularly in the case that the bandgap of the material used for the active layer is smaller than that of GaAs, in view of the fact that the bandgap of the $Ga_xIn_{1-x}P_yAs_{1-y}$ ($0<x\leq1$, $0<y\leq1$) layer, which is substantially free from Al (Al content is 1% or less with regard to the group III elements), is larger than the bandgap of GaAs. Because of this, non-optical recombination can be prevented. Accordingly, a vertical-cavity, surface-emission-type laser diode, operating with small current and having excellent reliability is realized.

In the case the lattice constant of the $Ga_xIn_{1-x}P_yAs_{1-y}$ ($0<x\leq1$, $0<y\leq1$) layer is smaller than the lattice constant of the GaAs substrate, the $Ga_xIn_{1-x}P_yAs_{1-y}$ ($0<x\leq1$, $0<y\leq1$) layer accumulates a tensile strain therein. Thus, crawling-up of defects from the substrate to a growth layer during a growth process is effectively suppressed. As a result, the efficacy of optical emission is improved. Further, it becomes possible to grow a layer accumulating a compressive strain of 2% or more, for example, as the active layer. Furthermore, it becomes possible to grow a strained layer with a thickness exceeding the critical film thickness.

In view of the fact that the $Ga_xIn_{1-x}P_yAs_{1-y}$ ($0<x\leq1$, $0<y\leq1$) layer contacts with the active region, and in view of the fact that the bandgap energy of the $Ga_xIn_{1-x}P_yAs_{1-y}$ ($0<x\leq1$, $0<y\leq1$) layer become larger with decreasing lattice constant, the hetero-barrier height between the active region and the $Ga_xIn_{1-x}P_yAs_{1-y}$ ($0<x\leq1$, $0<y\leq1$) is increased. Thus, the efficiency of carrier confinement is improved. Thereby, improvement with regard to temperature characteristics and threshold current are achieved.

In the case the lattice constant of the $Ga_xIn_{1-x}P_yAs_{1-y}$ ($0<x\leq1$, $0<y\leq1$) layer is larger than the lattice constant of the GaAs semiconductor substrate, the $Ga_xIn_{1-x}PyAs1-y$ ($0<x\leq1$, $0<y\leq1$) accumulates a the compressive strain. Thus, crawling up of defects formed during the growth process or existing in the substrate to the growth layer is suppressed, and the efficiency of optical emission is improved. Further, it becomes possible to grow a layer accumulating a compressive strain of 2% or more. Further, it becomes possible to grow a strained layer with a thickness exceeding the critical thickness.

In the case the sense of strain of the $Ga_xIn_{1-x}P_yAs_{1-y}$ ($0<x\leq1$, $0<y\leq1$) layer is the same as the sense of the strain of the active layer, there is an effect, in addition to the above-noted effect of insertion of the strained layer, in that the compressive strain that the active layer senses is reduced substantially. Thus, the adversary effect of the defects existing on the surface of a foundation layer, on which the growth is made, in the state immediately before the start of the growth process is reduced substantially. As a result, the crystal quality of the active layer improved and the characteristics of the laser diode are improved. Especially, this improvement is effective in vertical-cavity, surface-emission-type laser diode of long wavelength band in which growth of thick film is necessary.

The non-optical recombination elimination layer of the GaInPAs system containing P functions as an etching stopper with respect to the layer of the AlGaAs system that contains Al as a principal component. Because of this, the height of the mesa structure provided by a wet etching process for selective oxidation process is controlled exactly. By using the mesa structure, it becomes possible to form a current confinement layer by selectively oxidizing the layer that contains Al and As at the location above the non-optical recombination elimination layer. In this way, the accuracy of process control is improved. Further, the homogeneity and reproducibility is improved with regard to the device characteristics. Furthermore, the yield is improved, and the fabrication cost it reduced.

Further, according to the present invention, it becomes possible to form a vertical-cavity, surface-emission-type laser diode for use in long wavelength band of 0.9 μm or more on a GaAs substrate by using any of GaInNAs or GaInAs.

By providing a compressive strain of 2.0% or more to the active layer in the present invention, it becomes possible to realize a vertical-cavity, surface-emission-type laser diode operable at the wavelength hitherto not possible. For example, by using GaInAs for the active layer, it becomes possible to provide a vertical-cavity, surface-emission-type laser diode operable at the wavelength of 1.1 μm or longer. By using GaInNAs for the active layer, the crystal quality of the active layer is improved, and the threshold current density is reduced. Thereby, it becomes possible to provide a vertical-cavity, surface-emission-type laser diode having excellent reliability and still operable at the wavelength band of 1.3 μm or longer.

By arranging such a vertical-cavity, surface-emission-type laser diode in the form of one-dimensional or two-dimensional array, it is possible to provide a vertical-cavity, surface-emission-type laser-diode array with excellent homogeneity and reproducibility. In the case of forming an array, in-plane homogeneity influences the element-to-element variation of characteristics. As noted before, it is possible to use the crystal layer GaInPAs system as an etching stopper with respect to the crystal layer of AlGaAs system. Because of this, the height of the mesa structure used for the selective oxidation process is controlled exactly over the elements included in the array. Because of this, not only the precision of process control at the time of device fabrication is improved, but also the homogeneity of characteristics between the elements in the array and reproducibility of the vertical-cavity, surface-emission-type laser-diode array are improved also.

By using the vertical-cavity, surface-emission-type laser diode or the laser-diode array of the present invention as an optical source, in other words by using the vertical-cavity, surface-emission-type laser diode low-cost, high-quality and excellent reliability for the optical source, a low cost, highly efficient and reliable optical transmission module is realized.

By using the vertical-cavity, surface-emission-type laser diode or laser-diode array of the present invention as an optical source, in other words by using the vertical-cavity, surface-emission-type laser diode low-cost, high-quality and excellent reliability for the optical source, a low cost, highly efficient and reliable optical transceiver module is realized.

By using the vertical-cavity, surface-emission-type laser diode or laser-diode array of the present invention as an optical source, in other words by using the vertical-cavity, surface-emission-type laser diode low-cost, high-quality and excellent reliability for the optical source, a low cost, highly efficient and reliable optical telecommunication, including an optical-fiber telecommunication system and an optical interconnection system, is realized.

By providing a process for removing residual Al source material, residual Al product, residual Al compound or residual Al from a location such as the gas supply line or growth chamber, in which contact with a nitrogen compound source material or impurity included therein tends to occur, in the interval after the growth of the semiconductor layer containing Al but before the start of growth of the active layer that contains nitrogen in the fabrication process of the vertical-cavity, surface-emission-type laser diode, it becomes possible in the present invention to decrease the amount of oxygen taken into the active layer that contains nitrogen during the growth process of the active layer. Thereby, it becomes possible to grow the semiconductor light-emitting device without decreasing the efficiency of optical emission even in the case the active layer containing nitrogen is formed on the upper part of the semiconductor layer containing Al in the semiconductor light-emitting device.

By providing a process for removing residual Al source material, residual Al product, residual Al compound or residual Al from a location such as the gas supply line or growth chamber, in which contact with a nitrogen compound source material or impurity included therein tends to occur, in the interval after the growth of the semiconductor layer containing Al and before the end of growth of the non-optical recombination elimination layer in the fabrication process of the vertical-cavity, surface-emission-type laser diode, it becomes possible in the present invention to decrease the amount of oxygen taken into the active layer that contains nitrogen during the growth process of the active layer. Further, the adversary effect of non-optical recombination originating caused by oxygen taken into the growth interrupt interface at the time electric current is injected for device operation is successfully eliminated. Thereby, it becomes possible to obtain the semiconductor light-emitting device having a high efficiency of optical emission even in the case the active layer containing nitrogen is formed on the upper part of the semiconductor layer containing Al in the semiconductor light-emitting device.

By providing a process for removing residual Al source material, residual Al product, residual Al compound or residual Al from a location such as the gas supply line or growth chamber, in which contact with a nitrogen compound source material or impurity included therein tends to occur, in the fabrication process of the vertical-cavity, surface-emission-type laser diode by an MOCVD process that uses source materials of at least a metal organic Al source and a nitrogen compound source, it becomes possible to improve the efficiency of optical emission of the semiconductor light-emitting device as compared with the case in which no such a removal is made.

Other aspects and further features will become apparent from the following detailed description when read in conjunction with the attached drawings.

BRIEF DESCRIPTION OF THE DRAWINGS

FIGS. 9A and 9B are diagrams showing the construction of a vertical-cavity, surface-emission-type laser diode of Example 1;

DETAILED DESCRIPTION OF THE PREFERRED EMBODIMENTS

First Embodiment

Figure 1A:
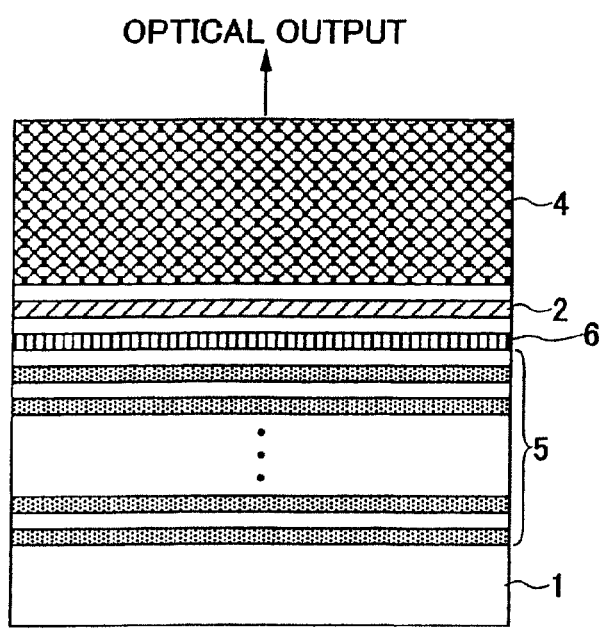
FIGS. 1A and 1B are diagrams showing the construction of a vertical-cavity, surface-emission-type laser diode according to a first embodiment of the present invention.
Figure 1B:
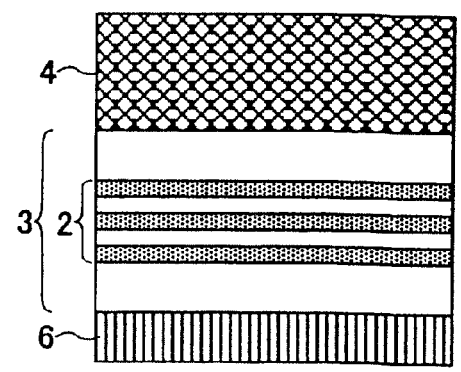

FIGS. 1A and 1B are diagrams showing a constitutional example of a vertical-cavity, surface-emission-type laser diode according to a first embodiment of the present invention, wherein FIG. 1B is an enlarged view of the active region of FIG. 1A.

Referring to FIGS. 1A and 1B, the vertical-cavity, surface-emission-type laser diode of the first embodiment includes an active region 3 on a semiconductor substrate 1, wherein the active region 3 includes at least one active layer 2 that produces a laser beam therein. Further, it includes a cavity structure formed of upper reflector 4 and a lower reflector 5 that sandwich the active layer from upward direction and downward direction for obtaining the laser beam. Each of the upper reflector 4 and the lower reflector 5 is formed of a semiconductor distributed Bragg reflector having a periodically changing refractive index, wherein the semiconductor distributed Bragg reflector reflects an incident optical beam incident thereto by optical interference. The semiconductor distributed Bragg reflector includes a low-refractive index layer of $Al_xGa_{1-x}As$ ($0<x\leqq1$) and a high-refractive index layer of $Al_yGa_{1-y}As$ ($\leqq y<x\leqq1$). Further, a non-optical recombination elimination layer 6 is provided between the active layer 2 and the lower reflector 5.

In the first embodiment, it is noted that the semiconductor distributed Bragg reflector forming the lower reflector 5 includes a semiconductor layer containing Al. On the other hand, it is also noted that the non-optical recombination elimination layer 6 is provided between the active layer 2 and the lower reflector 5. Because of this, crawling up of crystal defects, originating from Al and tend to be caused at the time of crystal growth of the active layer 2, to the active layer 2 is suppressed in the active region 3 (includes the active layer 2) sandwiched by the upper reflector 4 and the lower reflector 5. Thereby, the adversary influence associated with the Al defects is suppressed, and the active layer 2 can be formed with high crystal quality. In this active region 3, carrier injection is made. Thereby, non-optical recombination originating from crystal defects, which in turn are caused by Al, is effectively reduced, and the vertical-cavity, surface-emission-type laser diode of the present invention can be operated with reliability. Further, efficiency of optical emission and reliability are improved. As compared with the case in which all the low-refractive index layers of the semiconductor distributed Bragg reflector forming the lower reflector 5 are formed of $Ga_xIn_{1-x}P_yAs_{1-y}$ ($0<x\leqq1$, $0<y\leqq1$), a large refractive index difference is achieved in the present invention. Because of this, a high reflectance is achieved with fewer number of stacking. In other words, it is possible to obtain the above-mentioned effect without increasing the number of stacking of the reflector, or without increasing the total film thickness of the device.

It is possible to construct the reflector 4 by a dielectric multilayer mirror. In this case, the cladding layer used for confining the carriers may be provided between the upper reflector 4 and the active layer 6. In the construction of FIG. 1A, the optical output is taken out from the upper reflector 4. However, it is also possible to take out the optical output from the substrate 1.

Second Embodiment

Figure 2A:
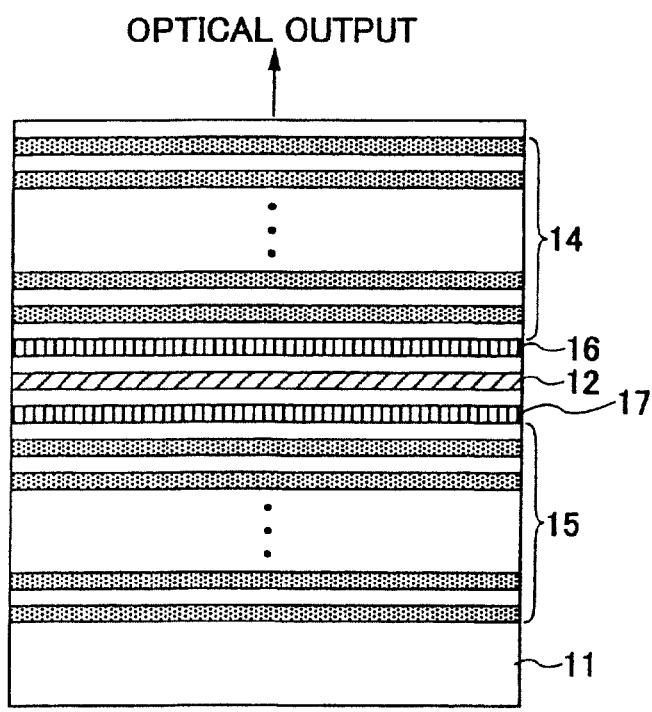
FIGS. 2A and 2B are diagrams showing the construction of a vertical-cavity, surface-emission-type laser diode according to a second embodiment of the present invention.
Figure 2B:
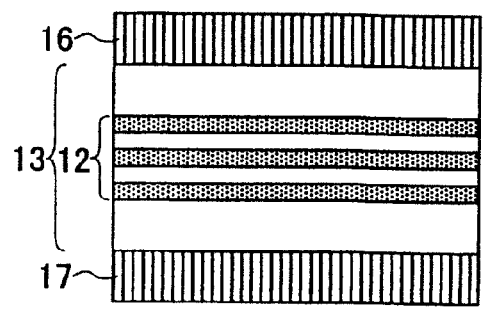

FIGS. 2A and 2B show the constitutional example of a vertical-cavity, surface-emission-type laser diode according to a second embodiment of the present invention, wherein FIG. 2B shows an enlarged view of the active region of FIG. 2A.

Referring to FIGS. 2A and 2B, the vertical-cavity, surface-emission type laser diode of the second embodiment of the present invention has an optical cavity structure including an upper reflector 14 and a lower reflector 15 that sandwich an active region 13 therebetween respectively from upward direction and from downward direction on a semiconductor substrate 11 for obtaining a laser beam, wherein the active region 13 includes at least one active layer 12 that produces the laser beam. Each of the upper reflector 14 and the lower reflector 15 has a refractive index profile that changes periodically and forms a semiconductor distributed Bragg reflector that reflects an incident optical beam incident thereto by optical interference. The semiconductor distributed Bragg reflector includes a low-refractive index layer of $Al_xGa_{1-x}As$ ($0<x\leq 1$) and a high-refractive index layer of $Al_yGa_{1-y}As$ ($0\leq y<x\leq 1$). Further, non-optical recombination elimination layers 16 and 17 are provided respectively between the active layer 12 and the lower reflector 15 and between the active layer 12 and the upper reflector 14.

By providing the non-optical recombination elimination layers 16 and 17 respectively between the active layer 12 and the reflector 14 and also between the active layer 12 and the reflector 15 in this second embodiment, crawling up of the crystal defects, originating from Al and tends to occur at the time of crystal growth of the active layer 12, to the active layer is suppressed effectively, even in the case the upper and lower reflectors 14 and 15 are formed of a semiconductor distributed Bragg reflector that includes a semiconductor layer containing Al. Thereby, adversary influence associated with this is also suppressed, and crystal defects caused by Al are reduced. Thus, the active layer 12 can be grown with high crystal quality. Furthermore, in view of the fact that the non-optical recombination elimination layers 16 and 17 are formed at the top and bottom of the active region 13 in which injection of carriers is conducted, the non-optical recombination caused by the crystal defects originating from Al is also reduced. Thereby, the efficiency of optical emission is improved, and the vertical-cavity, surface-emission-type laser diode can be operated with reliability. Also, the reliability of the device is not failed by the crystal defects. It is true that insertion the non-optical recombination elimination layer to only one side of the reflectors, as in the case of the first embodiment, is effective. When the non-optical recombination elimination layer is provided on the reflectors both sides, as in the case of the second embodiment, the effect is enhanced. Also, a large refractive index difference is realized in the upper and lower reflectors 14 and 15 as compared with the case in which all of the low-refractive index layers of in the semiconductor distributed Bragg reflector are formed of $Ga_xIn_{1-x}P_yAs_{1-y}$ ($0<x\leq 1$, $0<y\leq 1$). Because of this, a high reflectance is obtained with fewer number of stacking. Thus, it is possible to obtain the above-mentioned effect without increasing the number of stacking in the reflectors and without increasing the total film thickness of the device.

In FIG. 2A, the optical output is taken out from the upper reflector 14. However, it is possible to take out the optical output from the side of the substrate 11.

Third Embodiment

In a third embodiment of the present invention, GaAs is used for the semiconductor substrate 1 or 11 in the vertical-cavity, surface-emission-type laser diode of the above first or second embodiment. Further, the non-optical recombination elimination layer 6, 16 or 17 is formed of a $Ga_xIn_{1-x}P_yAs_{1-y}$ ($0<x\leq 1$, $0<y\leq 1$) layer.

It should be noted that the $Ga_xIn_{1-x}P_yAs_{1-y}$ ($0<x\leq 1$, $0<y\leq 1$) layer is free from Al (Al content with regard to group III elements is 1% or less) in the present embodiment and has a bandgap that can be larger than that of GaAs. Thus, by using the non-optical recombination elimination layers 6, 16 or 17 of $Ga_xIn_{1-x}P_yAs_{1-y}$ ($0<x\leq 1$, $0<y\leq 1$) in combination with an active layer having a bandgap smaller than that of GaAs, it become possible to eliminate the leakage of carriers to the layer containing Al through the $Ga_xIn_{1-x}P_yAs_{1-y}$ ($0<x\leq 1$, $0<y\leq 1$) layer. In this way, non-optical recombination is effectively and positively eliminated.

Fourth Embodiment

In a fourth embodiment of the present invention, the lattice constant of the $Ga_xIn_{1-x}P_yAs_{1-y}$ ($0<x\leq 1$, $0<y\leq 1$) layer used for the non-optical recombination elimination layer in the vertical-cavity, surface-emission-type laser diode the third embodiment is set smaller than the lattice constant of the semiconductor substrate of GaAs. Because of this, the non-optical recombination elimination layer of the present embodiment accumulates a tensile strain therein.

In an epitaxial growth process, a crystal layer is grown while reflecting the information of a foundation on which the epitaxial grow is made. Thus, when there is a defect on the substrate surface, the defect crawls up to the layer grown on the substrate. On the other hand, it is known that such a crawling up of the defect can be suppressed when there is provided a strained layer. In the event the defect has reached the active layer, the efficiency of optical emission is inevitably reduced. When the active layer has accumulated a strain therein, there occurs a decrease of critical thickness, and there arise problems such as growth of a layer with necessary thickness is not possible. Especially, the problem of failing to grow a layer due to the existence of defects arises in the case the compressive strain in the active layer is 2% or more, or in the case of growing a strained layer beyond the critical film thickness. In such cases, the growth is not possible even when a low-temperature growth process or other non-equilibrium growth process is employed. In the present invention, the lattice constant of the $Ga_xIn_{1-x}P_yAs_{1-y}$ ($0<x\leq 1$, $0<y\leq 1$) layer used for the non-optical recombination elimination layer is set smaller than the lattice constant of the semiconductor substrate formed of GaAs, and thus, the non-optical recombination elimination layer accumulates a tensile strain, and the $Ga_xIn_{1-x}P_yAs_{1-y}$ ($0<x\leq 1$, $0<y\leq 1$) layer forming the non-optical recombination elimination layer becomes a strained layer. As a result, the problem of crawling up of defects is effectively suppressed. Thereby, the efficiency of optical emission is improved and it becomes possible to grow the active layer even in the case the active layer accumulates a compressive strain of 2% or more. Further, it becomes possible to grow a strained layer with a thickness exceeding the critical thickness.

In the present embodiment, the $Ga_xIn_{1-x}P_yAs_{1-y}$ ($0<x\leq 1$, $0<y\leq 1$) layer used for the non-optical recombination elimination layer makes contact with the active region and functions also to confine the carriers in the active region. In the case of a $Ga_xIn_{1-x}P_yAs_{1-y}$ ($0<x\leq 1$, $0<y\leq 1$) layer, it should be noted that the bandgap energy increases with decreasing lattice constant. In the case of $Ga_xIn_{1-x}P$ ($y=1$), for example, the composition approaches to GaP with increasing compositional parameter x. Associated therewith, there occurs an increase of lattice constant and also the bandgap energy Eg. It should be noted that the bandgap Eg for direct transition is given as $Eg(\Gamma)=1.351+0.634x+0.786x^2$, while the bandgap energy for the case of indirect transition is given by $Eg(X)=2.24+0.02x$. Therefore, the hetero-barrier height formed between the active region and the $Ga_xIn_{1-x}P_yAs_{1-y}$ ($0<x\leq 1$, $0<y\leq 1$) layer is increased and the carrier confinement is improved. As a result of this, effects such as decrease of threshold current or improvement of temperature characteristics are obtained.

Fifth Embodiment

In a fifth embodiment of the present invention, the lattice constant of the $Ga_xIn_{1-x}P_yAs_{1-y}$ ($0<x\leq 1$, $0<y\leq 1$) layer, used for the non-optical recombination elimination layer in the vertical-cavity surface-emission type laser diode of the third embodiment, is set to be larger than that of the semiconductor substrate of GaAs. Because of this, the non-optical recombination elimination layer accumulates a compressive strain therein. Further, the lattice constant of the active layer is set larger than the lattice constant of the $Ga_xIn_{1-x}P_yAs_{1-y}$ ($0<x\leq1$, $0<y\leq1$) layer. Thus, the active layer accumulates a compressive strain.

As noted previously, growth of an epitaxial layer occurs while reflecting the information of the foundation on which the epitaxial growth is made. Therefore, the defect tends to crawl up to the grown layer when there is a defect existing on the substrate surface. On the other hand, it is known that the crawling up of defects like this is effectively suppressed, when there is provided a strained layer. When the above-noted defects have reached the active layer, the efficacy of optical emission is degraded inevitably. Meanwhile, there occurs a decrease of critical thickness in the active layer when the active layer accumulates a strain. Because of this, the problem that growth of the active layer with necessary thickness is not possible arises, especially when growing the active layer accumulating a compressive strain of 2% or more or when growing the strained active layer with a thickness larger than the critical film thickness. In such a case, because of the existence of defects, the growth is not possible even when a low-temperature growth process or other non-equilibrium growth processes are employed. In the present invention, the lattice constant of $Ga_xIn_{1-x}P_yAs_{1-y}$ ($0<x\leq1$, $0<y\leq1$) layer used for the non-optical recombination elimination layer is set larger than the lattice constant of the semiconductor substrate formed of GaAs. Because of this, the $Ga_xIn_{1-x}P_yAs_{1-y}$ ($0<x\leq1$, $0<y\leq1$) non-optical recombination elimination layer accumulates therein a compressive strain, and the crawling up of defects noted above is suppressed. Thereby, the efficiency of optical emission is improved. As a result, growth of an active layer accumulating a compressive strain of 2% or more or growth of the strained active layer beyond the critical thickness thereof becomes possible.

Furthermore, it should be noted that the strain accumulated in the $Ga_xIn_{1-x}P_yAs_{1-y}$ ($0<x\leq1$, $0<y\leq1$) layer works with the sense identical with the sense of the strain accumulated in the active layer. Because of this, the strain accumulated in the $Ga_xIn_{1-x}P_yAs_{1-y}$ ($0<x\leq1$, $0<y\leq1$) layer works so as to reduce the compressive strain, which the active layer senses. In view of the fact that influence of external factor increases with increasing strain, the construction of the present embodiment is especially effective in the case the compressive strain of the active layer is large, such as 2% or more, or in the case the thickness of the active layer exceeds the critical thickness.

The vertical-cavity, surface-emission-type laser diode of 1.3 μm band is preferably formed on a GaAs substrate. Further, semiconductor multilayer reflector is used frequently for the resonator. Thereby, it is necessary to grow the semiconductor layers of 50-80 layers before the growth of the active layer, so that the thickness becomes 5-8 μm.

In such a case, even when a GaAs substrate of high quality is used, the defective density at the surface on which the active layer is grown in the state immediately before the growth of the active layer increases inevitably over the defective density of the GaAs substrate surface, due to various reasons. For example, the defect that has once occurred crawls up in the direction of crystal growth. Also, defects can be formed at a hetero interface. When the actual compressive strain that the active layer senses is reduced, or when a strained layer is inserted in the state before the growth of the active layer is started, it becomes possible to reduce the influence of the defects existing on the surface ready for growth of the active layer thereon.

Sixth Embodiment

Figure 3A:
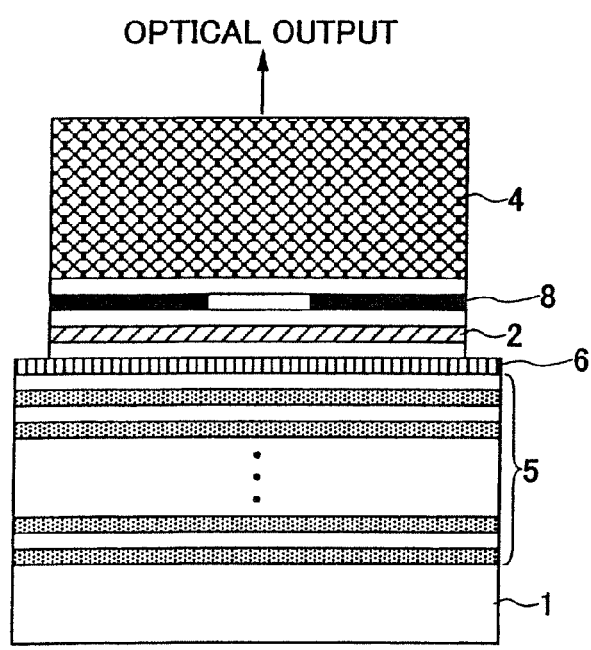
FIGS. 3A and 3B are diagrams showing a first constitutional example of the vertical-cavity, surface-emission-type laser diode of a sixth embodiment of the present invention.
Figure 3B:
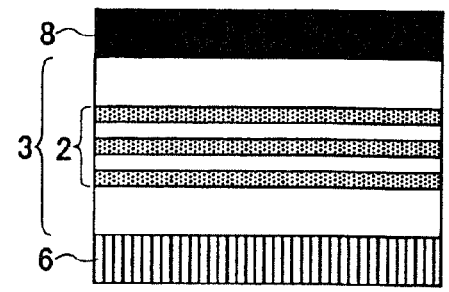
Figure 4A:
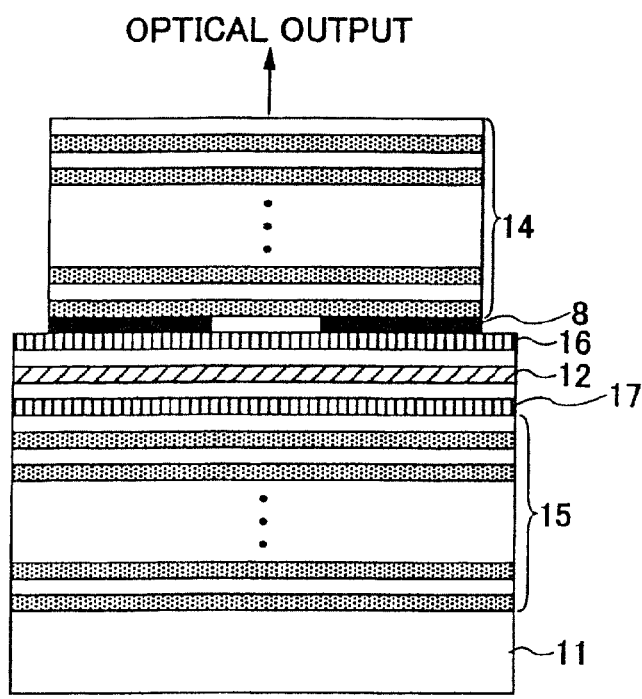
FIGS. 4A and 4B are diagrams showing a second constitutional example of the vertical-cavity, surface-emission-type laser diode of the sixth embodiment of the present invention.
Figure 4B:
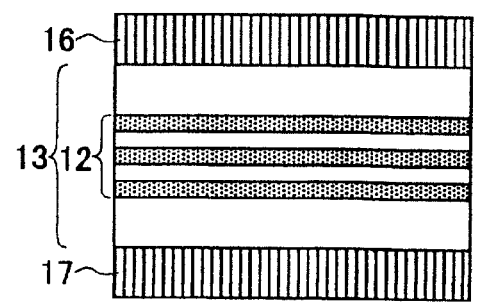

FIGS. 3A and 3B are diagrams (FIG. 3B is an enlarged view of the active region of FIG. 3A) showing a constitutional example of a vertical-cavity, surface-emission-type laser diode according to a sixth embodiment of the present invention. Also, FIGS. 4A and 4B are the diagrams (FIG. 4B is an enlarged view of the active region of FIG. 4A) showing a second constitutional example of the vertical-cavity, surface-emission-type laser diode of the sixth embodiment of the present invention. It should be noted that FIGS. 3A and 3B correspond to the vertical-cavity surface-emission type laser diode of the first embodiment (FIG. 1), while FIGS. 4A and 4B correspond to the vertical-cavity surface-emission type laser diode of the second embodiment (FIG. 2).

Referring to FIGS. 3A and 3B and FIGS. 4A and 4B, the vertical-cavity, surface-emission-type laser diode of the sixth embodiment includes current confinement layers 8 and 18 formed by selective oxidization of a selectively oxidized layer, formed primarily of AlAs, on the upper part of the $Ga_xIn_{1-x}P_yAs_{1-y}$ ($0<x\leq1$, $0<y\leq1$) layer (designated by the reference numeral 6 in FIGS. 3A and 3B, designated by the reference numeral 16 in FIGS. 4A and 4B), used for the non-optical recombination elimination layer The GaInPAs system layer including P and used for the non-optical recombination elimination layer in the present embodiment functions also as an etching stopper layer with respect to the layer of AlGaAs system that contains Al and As as primary components. Because of this, the height of the mesa structure, which is formed for the purpose of selective oxidation process of the current confinement layer 8 or 18, is controlled exactly, in the case the current confinement layer 8 or 18, which is subjected to selective oxidation process and contains Al and As as primary components, is formed in the upper part of the $Ga_xIn_{1-x}P_yAs_{1-y}$ ($0<x\leq1$, $0<y\leq1$) layer (represented by the reference numeral 6 in FIG. 3 and by the reference numeral 16 in FIG. 4). In this way, the accuracy of control of device fabrication process is improved in the sixth embodiment. Further, the homogeneity and reproducibility of the device characteristic are improved. Further, the fabrication cost is reduced.

Seventh Embodiment

In the seventh embodiment of the present invention, the active layer 2 or 12 in any of first through sixth embodiments described before, is formed by any of GaInNAs or GaInAs.

By using GaInNAs or GaInAs in the active layer 2 or 12, it becomes possible to construct a vertical-cavity, surface-emission laser diode of the wavelength band of 0.9 μm or longer on a GaAs substrate. In this case, the material system of AlGaAs/GaAs can be used and a large refractive index difference is achieved. Therefore, the total number of stacks in the semiconductor distributed Bragg reflector is reduced as compared with the case of forming the laser diode on an InP substrate, while simultaneously realizing a higher reflectance. In view of the fact that a widegap material can be formed to a GaAs substrate, it is possible in the present embodiment to increase the band discontinuity with respect to the active layer. As a result, the efficiency of carrier confinement is improved and a vertical-cavity, surface-emission type laser diode of long wavelength band is obtained with excellent temperature characteristics. It should be noted that the semiconductor distributed Bragg reflector forming the lower reflector 5 or 15 or the upper reflector 14 provides a larger refractive index difference as compared with the case in which all the low-refractive index layers are formed of the $Ga_xIn_{1-x}P_yAs_{1-y}$ ($0<x\leq1$, $0<y\leq1$) layer. Because of this, a high reflectance is obtained with fewer number of stacking. Thus, the laser diode of the present embodiment can reduce the crystal defects originating from and also the non-optical recombination, without increasing the number of stacking of the reflector and the total film thickness of the device. As a result, the reliability of the vertical-cavity, surface-emission type laser is improved.

Eighth Embodiment

In the eighth embodiment of the present invention, the active layer 2 or 12 accumulates a compressive strain of 2.0% or more in any of the first through seventh embodiments.

When a layer is grown on an underlying substrate with a lattice constant different from that of the substrate, the lattice deforms elastically and absorbs the energy. When a material having a lattice constant different from the lattice constant of the underlying substrate is growth with large thickness, on the other hand, there comes a point in which absorption of strain energy by elastic deformation is no longer possible and a misfit dislocation appears. This film thickness is called the critical thickness. It is difficult to produce a good device when the misfit dislocation has resulted.

Theoretically, the critical thickness ($h_c$), in which the misfit dislocation appears by a dynamic process, is given by the following equation proposed by Matthews and Blakeslee (J. Crystal Growth. 27, (1974) pp. 118-125)

$$h_c = \frac{b(1-v\cos^2\alpha)}{8\pi f(1+v)\cos\lambda}\left(\ln\left(\frac{h_c}{b}\right)+1\right) \quad \text{Eq. (1)}$$

wherein $v$ represents Poisson's ratio ($v=C_{12}/(C_{21}+C_{12})$; $C_{12}$ and $C_{21}$ being elastic stiffness constant), $\alpha$ is the angle formed by a Burger's vector and a line segment of a dislocation line at the interface (cos $\alpha=\frac{1}{2}$), $\lambda$ represents the angle formed between an intersection line of a slip surface and the interface and the Burger's vector (cos $\lambda=\frac{1}{2}$), b is given as $b=a/2^{1/2}$ (a; lattice constant), f represents the degree of lattice mismatching and hence strain represented as $f=\Delta a/a$, $\Delta a$ being a difference of lattice constant with respect to the underlying substrate. A compressive strain appears for the case in which the lattice constant of the material grown on the substrate is larger than the lattice constant of the substrate. On the other hand, a tensile strain appears in the opposite case. It should be noted that Eq. (1) is derived for the case in which a single layer film is grown on a substrate of infinite thickness. Hereinafter, the critical thickness hc given by Eq. (1) will be referred to as critical thickness based on the theory of Matthews and Blakeslee.

Figure 5:
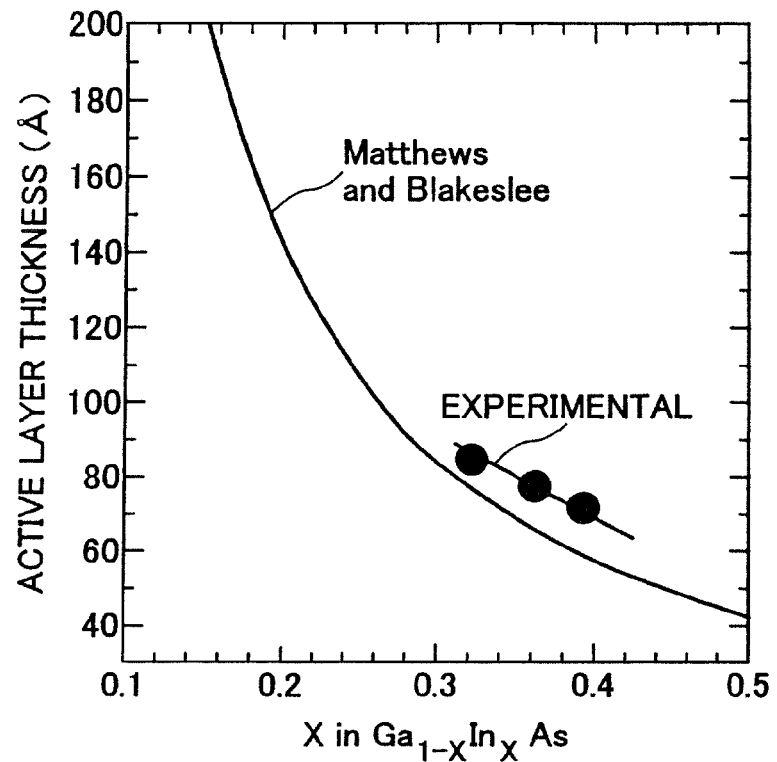
FIG. 5 is a diagram showing theoretical value and experimental value of critical thickness for a system of GaInAs layer formed on a GaAs substrate.

FIG. 5 shows the critical film thickness of a GaInAs layer calculated by the generally accepted theory of Matthews and Blakeslee noted above for the case in which the GaInAs layer is formed on a GaAs substrate. It should be noted that the lattice constant of $Ga_{1-x}In_xN_yAs_{1-y}$, a material system in which nitrogen (N) is added to $Ga_{1-x}In_xAs$, becomes equal to the lattice constant of $Ga_{1-x}In_xNAs$ in which the In content x is smaller by 3% (y=x−0.03) for addition of nitrogen of every 1%. In the case of forming a GaInAs layer on the GaAs substrate, increase of In content results in an increase of strain and the critical film thickness, which is a film thickness in which a two-dimensional growth is possible, is decreased. As a result of increase of the In content, the oscillation wavelength of a semiconductor light emission device (a laser diode) changes to long wavelength, in the case a GaInAs layer grown on a GaAs substrate is used. However, there simultaneously occurs an increase strain. The critical amount of strain in this case is about 2%. Corresponding to this, there is a limit in the increase of oscillation wavelength and it was said the wavelength of 1.1 μm would be the limit. Reference should be made to IEEE Photonics Technol. Lett. Vol. 9 (1197), pp. 1319-1321.

However, in practice, it is possible to form a material layer with In content of 30% or more, in other words, a material that accumulates a strain of 2% or more, in a GaInAs quantum well layer formed on a GaAs substrate, to a thickness exceeding the critical film thickness hc of Matthews and Blakeslee by using a non-equilibrium growth process such as MOCVD process or MBE process under a strongly non-equilibrium conduction such as lower temperature process conducted at about 600° C. or less. By doing so, the actual critical thickness (hc') exceeds the critical thickness of Matthews and Blakeslee, and it becomes possible grow a highly strained GaInAs quantum-well active layer having the strain of 2% with a thickness larger than the thickness conventionally possible. Because of this, a laser oscillation in the long wavelength band exceeding 1.2 μm is obtained. Laser oscillation in such long wavelength band has not been possible in conventional laser diodes and other semiconductor light emission devices. It should be noted that a Si semiconductor substrate is transparent with respect to this wavelength. In this way, it becomes possible to achieve optical transmission through the Si substrate in a circuit chip in which electron devices and optical devices are integrated on the Si substrate. Further, highly efficient HEMT (High electron mobility transistor) can be obtained.

FIG. 5 also represents experimental results.

Referring to FIG. 5, in the case the In content is 32% and the thickness is 8.6 nm, it can be seen that PL (photoluminescence) central wavelength is 1.13 μm. In the case the In content is 36% and the thickness is 7.8 nm, the PL central wavelength is 1.16 μm. Also, in the case the In content is 39% and the thickness is 7.2 nm, it can be seen that the PL central wavelength is 1.2 μm. In these cases, the critical thickness $h_c$ calculated on the basis of theory of Matthews and Blakeslee Eq. (1) is exceeded.

Figure 6:
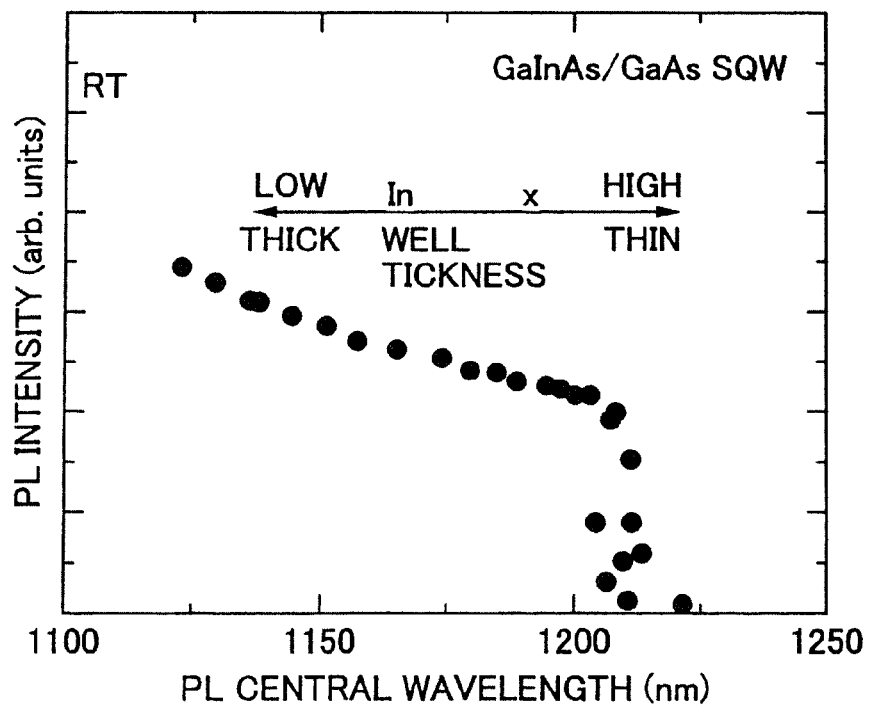
FIG. 6 is a diagram showing the relationship between PL central wavelength and PL intensity for the PL emission occurring in a GaInAs single quantum well layer.

Further, FIG. 6 shows the relationship between the PL central wavelength and PL intensity for a GaInAs single quantum well layer, wherein the In content x of the GaInAs well layer (represented by continuous line part the drawing) is set to 31-42%. Further, the thickness of the well layer is decreased to 9-6 nm simultaneously with the increase of the In content x. A strong PL intensity was obtained for the quantum well layer up to the wavelength of about 1.2 μm. It can be seen that the PL intensity decreases gradually up to the wavelength of 1.2 μm, while when the wavelength of 1.2 μm is exceeded, the PL intensity starts to fall off sharply. This corresponds to the flatness of the layer surface. More specifically, a mirror surface was obtained up to the wavelength of 1.2 μm. From these results, it is interpreted that the above kind of sharp decline of PL intensity is resulted because the thickness of the quantum well layer has exceeded the critical thickness $h_c$' substantially. In the case that a layer is grown with high growth rate by a strong non-equilibrium growth process such as MOCVD process or MBE process conducted at a low temperature, it is reported that there occurs an increase in experimentally obtained critical thickness. Further, there is a report that there occurs a three-dimensional growth, and hence roughening of surface, even when the layer thickness is smaller than the critical thickness based on the theory, depending on the growth condition (as in the case of high-temperature growth). Therefore, it is understood that the foregoing result reflects the situation in which the actual critical film thickness $h_c$' realized in the case of non-equilibrium growth at low-temperature exceeds the critical thickness $h_c$ based on the theory, and because of this, it was possible to grow a two-dimensional thick film without causing misfit dislocations.

Figure 7:
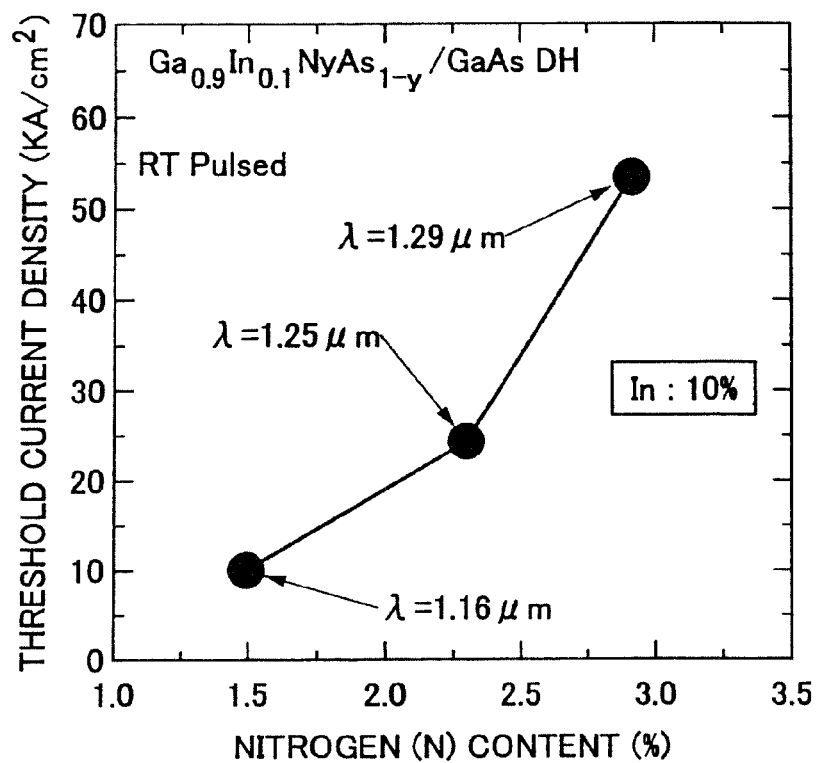
FIG. 7 is a diagram showing an example of relationship between the threshold current density and nitrogen contents for a GaInNAs laser diode (edge-emission type) having an In content of 10%.

In the case of the GaInNAs active layer, increase of strain means that it is necessary to increase the In content for obtaining the same wavelength, and because of this, it is possible to reduce the nitrogen concentration. FIG. 7 shows the relationship between the threshold current density and nitrogen content for a GaInNAs laser diode (edge-emission type) for the case of the In content of 10%. From FIG. 7, it can be seen that the threshold current density increases sharply with increase of the nitrogen content. The reason of this is attributed to degradation of crystal quality of the GaInNAs layer caused with the increase of the nitrogen content.

Figure 8:
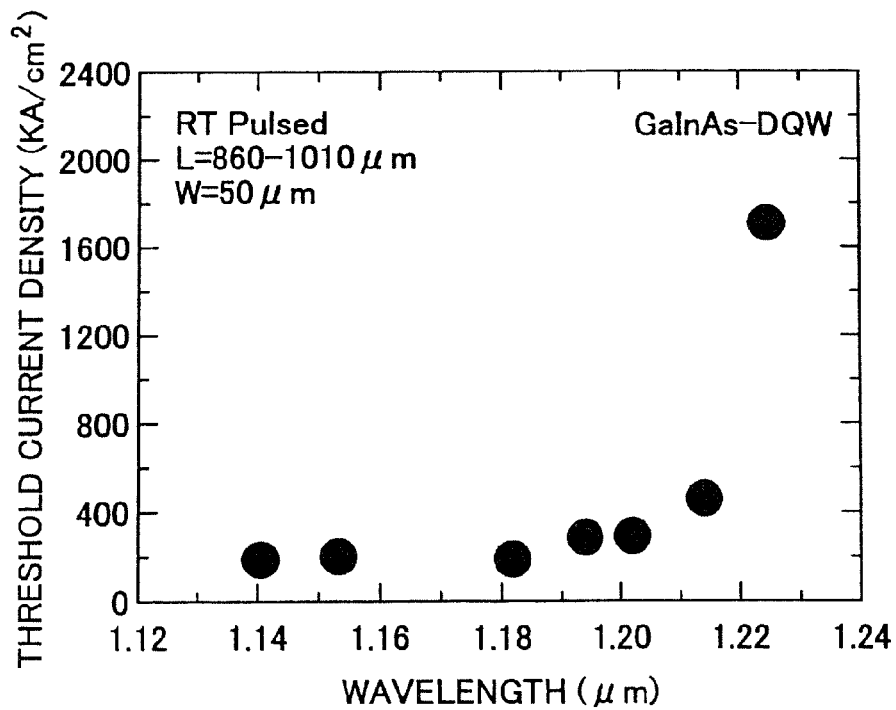
FIG. 8 is a diagram showing the relationship between oscillation wavelength and threshold current density of a GaInAs/GaAs-DQW laser diode of the present invention having a high compressive strain.

FIG. 8 shows the relationship between the oscillation wavelength and the threshold current density for the GaInAs/GaAs-MQW laser diode of the present invention having a strong compressive strain. The oscillation wavelength of a GaInAs/GaAs laser diode reported since before was about 1.1 μm. According to the experimental results by the inventor of the present invention, it was confirmed that operation up to the wavelength of 1.225 μm is possible at room temperature. Moreover, it can be seen that a low threshold is realized up to the wavelength of about 1.2 μm. It should be noted that these results reflect the PL characteristics shown in FIG. 6. In the case nitrogen is added to the highly strained GaInAs quantum well layer oscillating at about 1.2 μm in the nitrogen-free state, to obtain the wavelength of 1.3 μm, an amount of 0.5% of nitrogen is sufficient. It should be noted that about 3% of nitrogen had to be added in the case of the lattice-matched thick active layer of FIG. 7 in which the In content is 10%. Accordingly, it will be understood that the necessary amount of added nitrogen is reduced substantially. Associated therewith, the degradation of crystal quality is suppressed, and a highly efficient laser diode of the 1.3 μm band is realized. Thus, according to the present invention, the nitrogen content can be reduced and the crystal quality is improved. As a result, the characteristic of the GaInNAs laser diode is improved substantially.

Also, a vertical-cavity surface-emission-type laser diode of the 1.3 μm band is realized on a GaAs substrate by using a highly strained GaAsSb active layer.

Conventionally, there was no material suited for a laser diode of 1.1-1.3 μm wavelength bands. According to the present invention, this becomes possible by using a highly strained GaInAs, GaInNAs or GaAsSb having a strain of 2.0% or more. By using GaInNAs, especially, a further longer wavelength becomes possible.

It should be noted that such highly strained materials are extremely sensitive and are easily influenced by the strain of other layers, which may not cause a problem in the case of active layers of smaller strain, when the highly strained active layer is applied to a vertical-cavity surface-emission-type laser diode consisting of a plural layers. However, it becomes possible to eliminate this adversary influence by interposing the $Ga_xIn_{1-x}As_yP_{1-y}$ (0<x≦1, 0<y≦1) non-optical recombination elimination layer. For example, the $Ga_xIn_{1-x}As_yP_{1-y}$ (0<x≦1, 0<y≦1) layer is capable of adjusting the strain thereof by adjusting the composition thereof. Because of this, the above kind of adversary influence can be corrected by interposing the layer between the reflector and the active layer. Further, Al is very reactive and tends to become the cause of defects. On the other hand, it is said that the problem of crawling up of the defects from a foundation side (substrate) can be blocked when a layer containing In is provided. Accordingly, the present invention eliminates this problem by providing such a layer between the reflector containing Al and the active layer.

Ninth Embodiment

A ninth embodiment of the present invention provides a vertical-cavity, surface-emission-type laser-diode array by arranging a plurality of vertical-cavity, surface-emission-type laser diodes of the sixth embodiment.

In the case that an array is formed by using the vertical-cavity, surface-emission-type laser diode, in-plane homogeneity influences the device-to-device variation of characteristics. In view of the fact that AlGaAs system can be used as an/the etching stopper for a GaInPAs system, the height of the mesa structure formed for selective oxidation process is controlled exactly over the devices in the array. As a result, the accuracy of process control at the time of device fabrication is improved, and homogeneity and reproducibility of the device characteristic are improved over the devices forming the array.

Tenth Embodiment

In a tenth embodiment of the present invention, an optical transmission module is provided that uses a vertical-cavity, surface-emission-type laser diode of any of first through ninth embodiments as a light source.

In the tenth embodiment, a low-cost, highly quality and reliably optical transmission module is realized by using low-cost, high-quality and reliable vertical-cavity, surface-emission-type laser diode.

Eleventh Embodiment

In an eleventh embodiment of the present invention, an optical transceiver module is provided that uses a vertical-cavity, surface-emission-type laser diodes of any of first through ninth embodiments as a light source.

In the eleventh embodiment, a low-cost, high-quality and reliable optical transceiver module is realized by using the low-cost, high-quality and reliable vertical-cavity, surface-emission-type laser diode of any of first through ninth embodiments.

Twelfth Embodiment

In a twelfth embodiment of the present invention, an optical telecommunication system is provided that uses a vertical-cavity, surface-emission-type laser diode of any of first through ninth embodiments as a light source.

In the twelfth embodiment, low-cost, high-quality and reliable optical-fiber telecommunication system, optical interconnection system, and other optical telecommunication systems are realized by using a low-cost, high-quality and reliable vertical-cavity, surface-emission-type laser diode of any first through ninth embodiments.

Thirteenth Embodiment

In a thirteenth embodiment of the present invention, a fabrication process of vertical-cavity, surface-emission-type laser diodes of first through sixth embodiment will be provided for the case in which the active layers 2 and 12 are formed with a semiconductor layer containing nitrogen. In the process of the present embodiment, a process of removing Al source material, Al product, Al compound or Al remaining from a site, such as the gas supply line or the growth chamber in which the nitrogen source compound or the impurity contained in the nitrogen source compound may make a contact, is provided after the growth of the semiconductor layer that contains Al but before the start of growth of the growth of the active layer containing therein nitrogen.

It turned out that this invention has an effect especially in the case of the active layer 2 or 12 is an active layer containing nitrogen such as GaNAs, GaPN, GaNPAs, GaInNAs, GaInNP, GaNAsSb, or GaInNAsSb.

Figure 13:
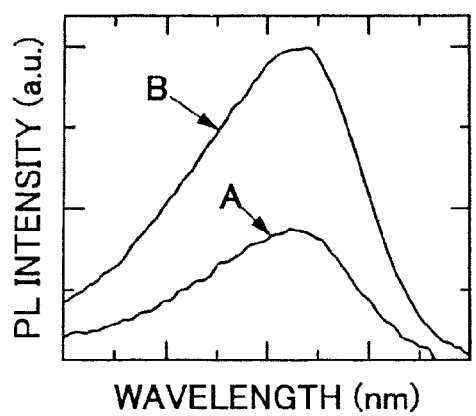
FIG. 13 is a diagram showing a room temperature photoluminescence spectrum from an active layer formed of GaInNAs/GaAs double quantum well structure.
Figure 14:
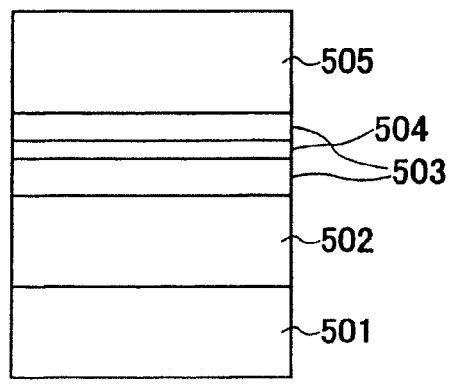
FIG. 14 is a diagram showing a basic structure of the sample used in a thirteenth embodiment of the present invention.

FIG. 13 is a diagram showing the room temperature photoluminescence spectrum of the active layer having the GaInNAs/GaAs double quantum well structure that consists of a GaInNAs quantum well layer and a GaAs barrier layer and produced by an MOCVD apparatus of the inventor of the present invention. In FIG. 13, the curve A represents the spectrum for the specimen in which the double-quantum well structure is formed on an AlGaAs cladding layer with a GaAs intermediate layer intervening therebetween. On the other hand, the curve B represents the spectrum for the specimen in which a double quantum well structure is formed continuously on a GaInP cladding layer with an intervening GaAs intermediate layer. FIG. 14, on the other hand, shows the fundamental structure of the specimens A and B. Referring to FIG. 14, the specimens A and B are basically formed on a GaAs substrate 501 by laminating a lower cladding layer 502, an intermediate layer 503, an active layer 504 containing nitrogen, an intermediate 503, and an upper cladding layer 505.

As represented in FIG. 13, the intensity of photoluminescence spectrum falls off more than one-half in the specimen A as compared with the specimen B. Thus, there has been a problem in that the emission intensity the active layer is degraded when the active layer of GaInNAs containing nitrogen is formed continuously on the semiconductor layer of AlGaAs that contains Al as a constituent element while using a single MOCVD apparatus. As a result, the threshold current density of the laser diode of the GaInNAs system formed on the AlGaAs cladding layer become more than twice as compared with case in which the laser diode is formed on the GaInP cladding layer.

Figure 15:
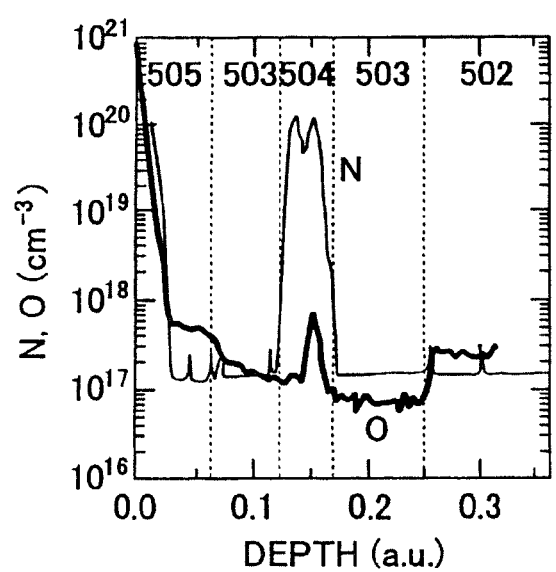
FIG. 15 is a diagram showing the depth distribution profile of nitrogen (N) and oxygen (O) in a laser diode of FIG. 14 for the case the laser diode has an active layer of GaInNAs/GaAs double quantum well structure, a GaAs intermediate layer and an AlGaAs cladding layer, for the case the laser diode is formed by using a single epitaxial growth (MOCVD) apparatus.

The inventor of the present invention conducted investigation about this problem. FIG. 15 shows the depth-distribution profile of nitrogen (N) and oxygen (O) in an exemplary laser diode of FIG. 14 that uses AlGaAs for the cladding layer 502, GaAs for the intermediate layer 503 and GaInNAs/GaAs double quantum well structure for the active layer 504, while using a single epitaxial growth (MOCVD) apparatus. The measurement was made by secondary ion mass spectroscopy. The measurement condition is shown in Table 1.

TABLE 1

| primary ion specie | $Cs^+$ |
|---|---|
| primary acceleration voltage | 3.0 kV |
| sputtering rate | 0.5 nm/s |
| measurement area | 160 × 256 μm$^2$ |
| degree of vacuum | <3E−7 Pa |
| polarity of measured ions | − |

In FIG. 15, there can be seen two nitrogen peaks in the active layer 504 in correspondence to the GaInNAs/GaAs double quantum well structure. Further, a peak of oxygen is detected in the active layer 504. However, it can be seen that the oxygen concentration in the intermediate layer 503 that does not contain Al is about one order lower than the oxygen concentration of the active layer 504.

On the other hand, in the case the depth-distribution profile of the oxygen concentration was measured for the laser diode device that uses GaInP for the cladding layer 502, GaAs for the intermediate layer 503, and GaInNAs/GaAs double quantum well structure for the active layer 504, it was confirmed that the oxygen concentration in active layer 504 background level.

In other words, it became clear by the experiment of the inventor that oxygen is taken into the active layer 504 that contains nitrogen, when the laser diode is grown continuously by a single epitaxial growth apparatus while using a nitrogen compound source material and a metal-organic Al source material continuously such that the laser diode has the semiconductor layer 502 containing Al between the substrate 501 and the active layer 504 that contains nitrogen. Oxygen thus taken into the active layer 504 forms a non-optical recombination state, and because of this, the efficacy of optical emission of the active layer 504 is decreased substantially. Further, it became clear that oxygen thus taken into the active layer 504 becomes the cause of decrease of the efficacy of a laser diode for the case the laser diode includes the semiconductor layer 502 containing Al between the active layer 504 and the substrate 501. It is thought that origin of the oxygen contamination would be the material containing oxygen and remaining in the apparatus or a material containing oxygen and included as impurity in the nitrogen compound source material.

Figure 16:
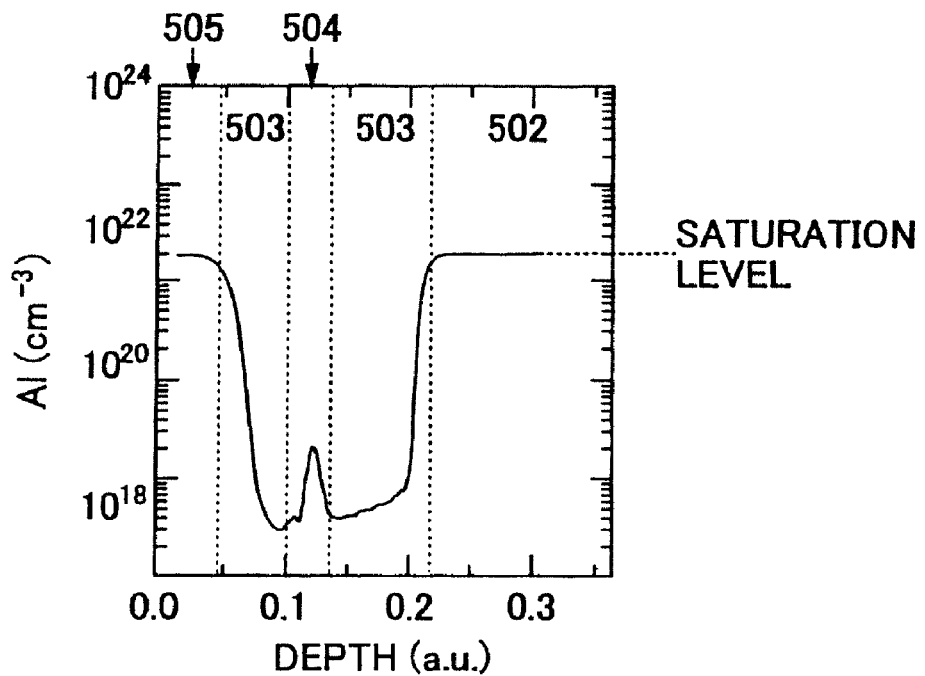
FIG. 16 is a diagram showing a depth distribution profile of Al in the same sample of FIG. 15.

Next, an investigation was made about the cause the oxygen incorporation. FIG. 16 shows the depth distribution profile of in the same sample as FIG. 15. It should be noted that the measurement was made by secondary ion mass spectroscopy under the condition represented in Table 2.

TABLE 2

| primary ion specie | O2+ |
|---|---|
| primary acceleration voltage | 5.5 kV |
| sputtering rate | 0.3 nm/s |
| measurement region | 60 μmΦ |
| degree of vacuum | <3E−7 Pa |
| polarity of measured ion | + |

From FIG. 16, it will be understood that Al is detected in the active layer 504 in which no Al source material is used. On the other hand, in the intermediate layer (GaAs layer) 503 adjacent to the semiconductor layer (the cladding layer) 502 or 505 containing Al, it will be noted the Al concentration level is lower than the Al concentration of the active layer 504 by one order or more. This indicates that the Al contamination in the active layer 504 is not caused by diffusion and substitution of Al from the semiconductor layer (cladding layer) 502 or 505 that contains Al.

On the other hand, no Al was detected in the active layer in the case the active layer containing nitrogen is grown on the semiconductor layer not containing Al, such as GaInP.

Thus, it is concluded that Al detected in the active layer 504 as represented in FIG. 16 originates either from Al remaining in the gas supply line or growth chamber, or from Al source, Al product, Al compound or Al, taken into the active layer 504 by combining with a nitrogen source compound or with the impurity (water) contained in such a nitrogen source compound. In other words, it was newly discovered by the inventor that Al is taken naturally into the active layer containing nitrogen, when a laser diode that includes a semiconductor layer containing Al between the substrate and the active layer containing nitrogen continuously in a single epitaxial growth apparatus while using a nitrogen source compound and a metal-organic Al source material.

When comparison is made with respect to the depth distribution profile of nitrogen and oxygen concentration in a laser diode having a construction identical with that of FIG. 15, it will be noted that the two oxygen peak profiles in the double quantum-well active layer 504 do not correspond with the peak profile of nitrogen but correspond to the Al concentration profile of FIG. 16. From this, it became clear that the oxygen impurity in the GaInNAs well layer is not incorporated together with the nitrogen source compound but is incorporated into the well layer in the form coupled with Al. In other words, Al causes coupling with a material containing oxygen such as water contained in the nitrogen compound source or water remaining in the gas line or reaction chamber, as the Al source material, Al product or Al compound or Al remaining in the processing chamber causes contact with a nitrogen source compound. In this way, Al and oxygen are taken into the active layer 504. It was this oxygen that was taken into active layer 504 in this way that has caused decrease of efficacy of optical emission in the active layer 504. The above became clear for the first time by the experiments of the inventor of the present invention.

Thus, in order to eliminate this problem, it is necessary to provide a process for removing the Al source material, Al product, Al compound or Al remaining in the processing chamber or a site where there is a chance that these Al-containing material makes a contact with impurity in the nitrogen source compound.

By providing such a process after the growth of the semiconductor layer 502 that contains Al but before the start of growth of the active layer 504, which contains nitrogen, the concentration of the impurity that contains Al and oxygen and incorporated into the active layer through the mechanism of the nitrogen source compound or impurity contained in the nitrogen source compound causing a reaction with the residual Al source material, Al product, Al compound or Al, is reduced effectively. Further, the adversary influence on the non-optical recombination in active layer 504 is successfully reduced even when the carriers are injected in the active layer 504 by current injection, provided that the residual Al is removed before the end of the growth process of the non-optical recombination elimination layer.

For example, a room temperature continuous oscillation became possible by reducing the Al concentration in the active layer 504 containing nitrogen, to the level of $1\times10^{19}$ cm$^{-3}$ or less. Furthermore, an optical emission characteristic equivalent to the one for the case in which the active layer is formed on a semiconductor layer not containing Al is obtained by reducing the Al concentration in the active layer 504 containing nitrogen to $2\times10^{18}$ cm$^{-3}$ or less.

Table 3 shows the result of evaluation of threshold current density for a broad stripe laser diode having a GaInNAs double quantum well structure (layer containing nitrogen) and a cladding layer (layer containing Al) of AlGaAs.

TABLE 3

| cladding layer | Al in active layer [/cm3] | O in active layer [/cm3] | threshold current density [kA/cm2] |
|---|---|---|---|
| AlGaAs | >2E+19 | >1E+18 | >10 |
| AlGaAs | 8-9E+18 | 9E+17 | 2-3 |
| AlGaAs | <1E+18 | <2E+17 | 0.8 |
| GaInP | <2E+17 | <2E+17 | 0.8 |

From Table 3 it can be seen that Al of $2\times10^{19}$ cm$^{-3}$ or more and oxygen of $1\times10^{18}$ cm$^{-3}$ or more are incorporated into the active layer in the structure, in which an active layer containing nitrogen is grown continuously on a semiconductor layer that contains Al. Thus, the threshold current density takes a remarkably high value of 10 kA/cm$^2$ or more. However, the oxygen concentration in the active layer is reduced to $1\times10^{18}$ cm$^{-3}$ or less when the Al concentration in the active layer is reduced to $1\times10^{19}$ cm$^{-3}$ or less. Along with this, the broad stripe laser diode can oscillate at the threshold current density of 2-3 kA/cm. When the active layer has a crystal quality characterized by the threshold current density of several kilo-amperes/cm$^2$ or less, room temperature continuous oscillation of the broad stripe laser diode becomes possible. Accordingly, it is concluded that by controlling the Al concentration in the active layer containing nitrogen to be $1\times10^{19}$ cm$^{-3}$ or less, it becomes possible to produce a laser diode that can oscillate continuously at room temperature.

Thus, in the thirteenth embodiment of the present invention, oxygen taken into the active layer that contains nitrogen at the time of growth of the active layer is reduced successfully, by providing the process of removing residual Al source material, Al product, Al compound or Al from the site, such as gas supply line or growth chamber, in which the nitrogen source compound or impurity contained therein may make a contact, after the growth of the semiconductor layer containing Al but before the start of growth of the active layer. As a result, it becomes possible to grow a semiconductor light-emitting device having an active layer containing nitrogen formed on or above a semiconductor layer containing Al, without reducing the efficacy of optical emission.

Fourteenth Embodiment

In a fourteenth embodiment of the present invention, a process for purging a carrier gas is provided in the fabrication process of a vertical-cavity, surface-emission-type laser diode of the thirteenth embodiment after the growth of the semiconductor layer containing Al but before the end of the growth process of the non-optical recombination elimination layer, for removing residual Al source material, Al product, Al compound or Al from a site, such as gas supply line or growth chamber, in which a nitrogen source compound or impurity contained therein may make a contact.

Thus, according to the fourteenth embodiment, there is provided a purging process, after the process of growing the semiconductor layer 502 containing Al but before the start of growth of the active layer 504 containing nitrogen, for purging the residual Al source material, Al product, Al compound or Al from a site in which the nitrogen compound source material or impurity contained therein may make a contact, by using a carrier gas.

Here, the time of the purging process is defined as a time interval after interruption of supply of the Al source material to the growth chamber with the termination of growth of the semiconductor layer 502 containing Al but before starting supply of the nitrogen source compound for commencing the growth of the active layer 504 that contains nitrogen.

As noted previously, the Al source material, Al product, Al compound or Al may remain in the growth chamber, when a semiconductor layer containing Al as constituent element. However, it is possible to decrease the concentration of residual Al gradually remaining in the growth chamber, by purging the gas line and the growth chamber with the carrier gas.

Specifically, the Al concentration in the active layer can be reduced to $1\times10^{19}$ cm$^{-3}$ or less with the purging process of about 10 minutes. Thus, the efficacy of optical emission in the active layer is improved and it becomes possible to construct a laser diode device that oscillates continuously at room temperature.

By providing the purging process over 30 minutes or more, it is possible to decrease the Al concentration level to $1 \times 10^{18}$ cm$^{-3}$ or less.

As a purging method, there is a process to interrupt the growth of the intermediate layer that does not contain Al and carry out the purging with the carrier gas. In the case that process of interrupt growth and purge is to be used, such an interruption of growth can be provided after the growth of the semiconductor layer containing Al up to midway of growth of the non-optical recombination elimination layer.

Figure 17:
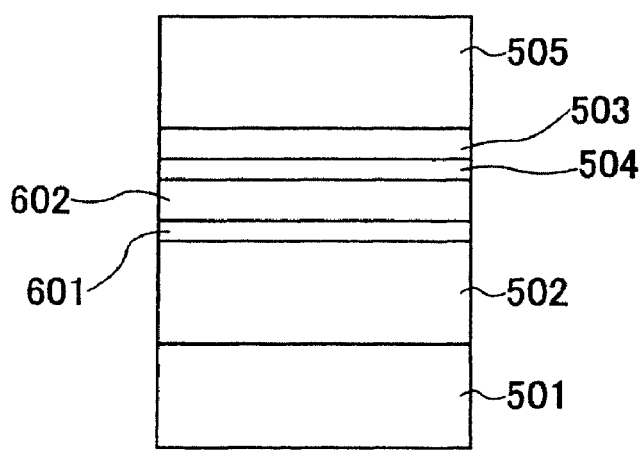
FIG. 17 is a diagram showing an example of the laser diode device according to a fourteenth embodiment of the present invention.

FIG. 17 shows an example of the laser diode according to the fourteenth embodiment of the present invention. The laser diode of FIG. 17 is formed on the substrate 501 by consecutively laminating thereon the semiconductor layer 502 containing Al as a constituent element, a first lower intermediate layer 601, a second 2nd lower intermediate layer 602, an active layer 504 containing nitrogen, the upper intermediate layer 503 and, the second semiconductor layer 505.

In the crystal growth of the laser diode of FIG. 17, an epitaxial growth apparatus that uses a metal-organic Al source material and an organic nitrogen source material is used. Thereby, a growth interruption process is provided after the growth of the first lower intermediate layer 601 but before the start of growth of the second lower intermediate layer 602. During the growth interruption process, the Al source material, Al product, Al compound or Al remaining in the site where the nitrogen source compound or the impurity contained in the nitrogen source compound in the growth chamber may make a contact is removed by purging with hydrogen that is used for a carrier gas.

Figure 18:
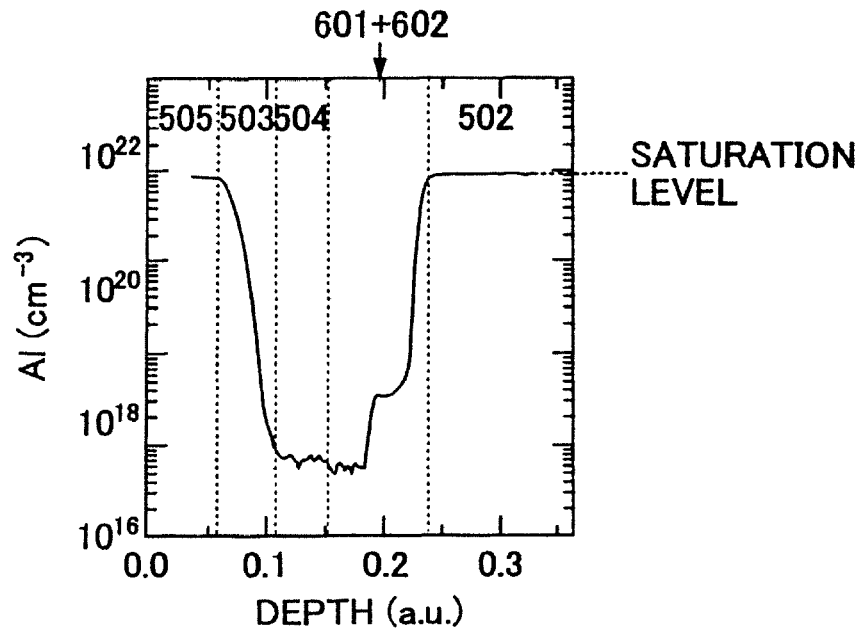
FIG. 18 is a diagram showing a depth distribution profile of Al in depth direction of the laser diode of FIG. 17 for case the growth crystal layers is interrupted between the a first lower intermediate layer and a second lower intermediate layer and conducted a purging process for 60 minutes.

FIG. 18 shows the result of measurement of depth distribution of Al to the laser diode device for the case the growth interruption is provided between the first lower intermediate layer 601 and the second lower intermediate layer 602 for a duration of 60 minutes. As can be seen in FIG. 18, the Al concentration in the active layer 504 can be reduced to the level of $3 \times 10^{17}$ cm$^{-3}$ or less. This value of Al concentration is generally the same as the Al concentration in the intermediate layer.

Figure 19:
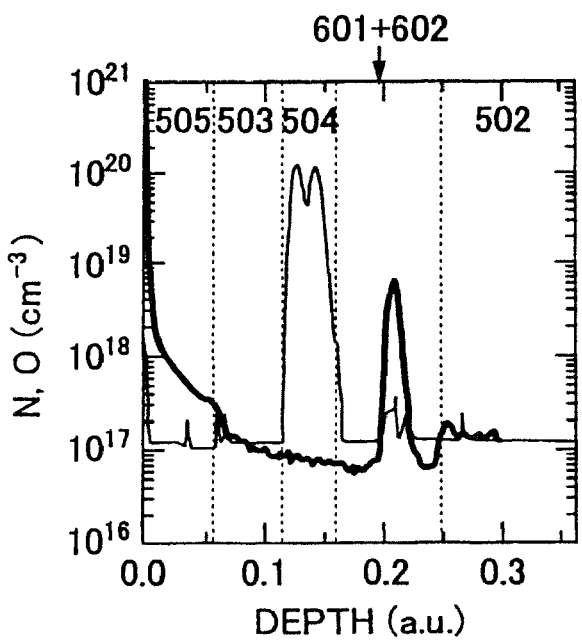
FIG. 19 is a diagram showing a depth distribution profile of nitrogen (N) and oxygen (O) in the same device as FIG. 18.

FIG. 19 shows the result of measurement of the depth distribution profile of nitrogen (N) and oxygen (O) for the same device as the device of FIG. 18. As shown in FIG. 19, the oxygen concentration in active layer 504 was reduced the background level of $1 \times 10^{17}$ cm$^{-3}$.

It should be noted that the oxygen peak appearing in the lower intermediate layers 601 and 602 is caused by segregation of oxygen to the interface in which the growth was interrupted. Therefore, it is preferable to provide such a growth interruption after the growth of the semiconductor layer containing Al and before the end of the growth process of the non-optical recombination elimination layer. This is because the non-optical recombination elimination layer can have an increased bandgap energy as compared with the quantum-well active layer or the barrier layer and that it is because the adversary effect of non-optical recombination caused by oxygen that segregated to the growth interruption interface is suppressed when the carriers are injected to the active layer by current injection.

In the illustrated example, growth of the laser diode is interrupted between the first lower intermediate layer 601 and the second lower intermediate layer 602. By conducting the purging process for 60 minutes, impurity concentration level of Al, oxygen, and the like, in the active layer 504 containing nitrogen was reduced. With this, the efficacy of optical emission of the active layer 504 containing nitrogen was improved.

During the purging process of the growth chamber conducted with the carrier gas, the efficiency of removing the Al source material or reaction product adsorbed on a susceptor or periphery of the susceptor is improved by conducting the purging process while heating the susceptor.

When the substrate is heated simultaneously, it should be noted that the group V source gas such as AsH$_3$ or PH$_3$ has to be supplied continuously to the growth chamber during the growth interruption so as to prevent that the outermost surface of the semiconductor layer 505 experiences thermal decomposition.

When purging the growth chamber with the carrier gas, it is also possible to move the substrate to another chamber from the growth chamber. In this case in which the substrate is moved to another chamber from the growth chamber, it is not necessary to supply the group V source gas of AsH$_3$ or PH$_3$ to the growth chamber during the process of purging conducted while heating the susceptor. Accordingly, thermal decomposing of the reaction product of Al deposited on the susceptor or periphery of the susceptor is facilitated, and the Al concentration inside the growth chamber is reduced effectively.

Further, it is also possible to carry out the purging during the growth process of the intermediate layer. Because of the fact that the non-optical recombination elimination layer is provided between the reflector of the AlGaAs system, which contains Al, and the active layer containing nitrogen, the distance between the active layer containing nitrogen and the layer containing Al is increased. Because of this, there is a merit that the duration of purging can be increased when the purging process is conducted simultaneously to the growing process. In this case, it is preferable to reduce the growth rate for securing sufficient purge time.

Fifteenth Embodiment

In a fifteenth embodiment of the present invention, the vertical-cavity, surface-emission-type laser diodes of the thirteenth and fourteenth embodiments are formed by a crystal growth process that uses an MOCVD process while using at least a metal-organic Al source material and a nitrogen source compound.

In a semiconductor light-emitting device having a semiconductor layer containing Al between a substrate and an active layer that contains nitrogen, no remarkable decrease of efficacy of optical emission is reported when the semiconductor device is produced it with a crystal growth process that does not use a metal-organic-metal Al source material and a nitrogen source compound such as an MBE process. In the case an MOCVD process is used, on the other hand, decrease of efficacy of optical emission is reported for a GaInNAs active layer formed on a semiconductor layer containing Al. According to the article in Electron Lett., 2000, 36 (21), pp 1776-1777, it is reported that the intensity of photoluminescence decreases remarkably when a GaInNAs quantum well layer is grown continuously on an AlGaAs cladding layer in the same MOCVD growth chamber, even in the case an intermediate layer of GaAs with is provided. In the above report, therefore, the AlGaAs cladding layer and the GaInNAs active layer are grown in different MOCVD growth apparatuses for improving the photoluminescent intensity. Accordingly, this problem is thought to be a problem that cannot be avoided in the case of conducting a crystal growth process while using a metal-organic source of Al and nitrogen source compound, as in the case of MOCVD process.

In an MBE process, the crystal growth is carried out in a highly vacuum environment. Contrary to this, an MOCVD process is conducted under a process pressure much higher than the process pressure of an MBE process of several ten Torr to atmospheric pressure. Because of this, the mean free path of the gas molecules is overwhelmingly short in the MOCVD process. Thus, there are many opportunities that the supplied source material molecules and the carrier gas molecules cause contact and reaction with the gas line, reaction chamber or other parts. This is the reason why it is preferable to provide the process for removing the residual Al source material, Al product, Al compound, or Al, in the case of a process such as MOCVD process that uses a high pressure for the growth chamber or for the gas line, from the site in which the nitrogen source compound or impurity contained in the nitrogen source compound may cause a contact, after the growth of the semiconductor layer containing Al before the growth of the active layer containing nitrogen (more preferably before the end of the growth process of the non-optical recombination elimination layer). By doing so, the effect of reducing the amount of oxygen taken into the active layer containing nitrogen is increased.

EXAMPLES

Below, explanation will be made on various examples of the present invention.

Example 1

FIGS. 9A and 9b show the constitutional example of a vertical-cavity, surface-emission-type laser diode of Example 1, wherein FIG. 9B shows an enlarged view of an active region of FIG. 9A. The vertical-cavity, surface-emission-type laser diode of FIGS. 9A and 9b are formed on an n-GaAs substrate 101 having a (100) surface orientation and includes an n-semiconductor distributed Bragg reflector (AlAs/GaAs lower reflectors) 104 formed on the substrate 101, wherein the n-semiconductor distributed Bragg reflector includes alternate repetition of an n-$Al_xGa_{1-x}As$ (x=1.0) and an n-$Al_yGa_{1-y}As$ (y=0) repeated for 35 times, with respective thicknesses of ¼ times the oscillation wavelength λ (λ/4 thickness) in the respective media. Further, an n-$Ga_xIn_{1-x}P_yAs_{1-y}$ (x=0.5, y=1) layer (a non-optical recombination elimination layer) 103 is laminated at the top with the thickness of λ/4. In the Example 1, it should be noted that the n-$Ga_xIn_{1-x}P_yAs_{1-y}$ (x=0.5, y=1) layer 103 is a low-refractive index layer and forms a part of the lower reflector 104.

On the non-optical recombination elimination layer 103, a lower undoped GaAs spacer layer 105, a multiple quantum-well active layer 106 formed of three $Ga_xIn_{1-x}As$ quantum well layers (quantum-well active layer) 106a and corresponding GaAs barrier layers 106b (thickness of 20 nm), and an upper GaAs spacer layer 107 are laminated. In this way, an optical cavity having a thickness corresponding to one wavelength (thickness of λ) of the oscillation wavelength measured in the medium is formed.

Further, a periodical structure (1 period) is formed thereon by laminating a C-doped p-$Ga_xIn_{1-x}P_yAs_{1-y}$ (x=0.5, y=1) layer (non-optical recombination elimination layer) 108 and a Zn-doped p-$Al_xGa_{1-x}As$ (x=0) layer alternately with a ¼ thickness of the oscillation wavelength as measured in respective media. Further, a semiconductor distributed Bragg reflector ($Al_{0.9}Ga_{0.1}As$/GaAs upper reflector) 109 is formed thereon by alternate deposition of a C-doped p-$Al_xGa_{1-x}As$ (x=0.9) layer and a Zn-doped p-$Al_xGa_{1-x}As$ (x=0) layer to form a periodical structure (25 periods) with the thickness of ¼ times the oscillation wavelength in each of the media. In the Example 1, it should be noted that the p-$Ga_xIn_{1-x}P$ (x=0.5, y=1) layer 108 is a low-refractive index layer and forms a part of the upper reflector 109.

It should be noted that the uppermost p-$Al_xGa_{1-x}As$ (x=0) layer 110 has a role also of a contact layer (the p-contact layer) contacting with a p-side electrode 112.

Here, it should be noted that the In content x of the quantum-well active layer 106a is set to 39% ($Ga_{0.61}In_{0.39}As$). Further, the thickness of the quantum-well active layer 106a is set to 7 nm. The quantum-well active layer 106a accumulated a compressive strain of about 2.8% with respect to the GaAs substrate 101.

In the Example 1, the growth of the entire vertical-cavity, surface-emission-type laser diode is conducted by an MOCVD process. In this case, lattice relaxation was not observed. TMA (trimethyl aluminum), TMG (trimethyl gallium), TMI (trimethyl indium), $AsH_3$ (arsine) and $PH_3$ (phosphine) are used for the source materials of the layers that constitute the laser diode. Further, $H_2$ is used for the carrier gas. In the case the strain in the active layer (quantum-well active layer) 106a is large as in the present case of the Example 1, it is preferable to use a low-temperature growth process that proceeds under a non-equilibrium state. In Example 1, the GaInAs layer (quantum-well active layer) 106a is grown at 550° C. It should be noted that an MOCVD process is suited for crystal growth of highly strained active layer due to large the degree of saturation. Further, an MOCVD process is advantageous in the point that it does not require high vacuum environment as in the case of an MBE process. Further, an MOCVD process is advantageous for mass production in view of the fact that the process is easily controlled by controlling flow rate and supply time of source gases.

In Example 1, a current confinement structure is formed also by forming an insulation layer (high-resistance region) 111 outside the current path by irradiating of proton ($H^+$).

Further, a p-side electrode 112 is formed on the p-contact layer 110 forming a part of the upper reflector in Example 1 as an uppermost of layer, except for an optical beam exit region 114. Also, an n-side electrode 113 is formed on the back surface of the substrate.

In Example 1, it should be noted that the active region sandwiched between the upper and lower reflectors 104 and 109 and causing recombination of the carriers injected thereto (resonator formed of the upper and lower spacer layers 105 and 107 and the multiple quantum-well active layer 106 in Example 1), do not use a material containing Al (the proportion of Al with regard to the group III element is 1% or more). Furthermore, the layers 103 and 108 in the lower reflector 104 and the upper reflector 109 located closest to the active layer 106 have a composition of $Ga_xIn_{1-x}P_yAs_{1-y}$ (0<x≦1, 0<y≦1). It should be noted that the carriers are confined between the low-refractive index layers of the upper reflector 109 and the lower reflector 104 having a widegap and located closest to the active layer 106. Because of this, when the low-refractive index layer (wide gap layer) of the reflector that contacts with the active region contained Al, there would occur non-optical recombination of carriers at the interface with injection of carriers, even in the case the active region is formed of a layer not containing Al (the proportion of Al with respect to other the group III elements is 1% or less). As a result, the efficacy has of optical emission would fall off inevitably. In view of the object of the present invention, it is preferable to form the active region by layers not containing Al.

In Example 1, it should be noted that the active region and the interface between the active region and the reflectors 104 and 109 do not contain Al. Because of this, the problem of non-optical recombination of carriers caused by crystal defects, which in turn originate from Al, at the time of the carrier injection is eliminated. As a result, non-optical recombination is successfully reduced.

It is naturally preferable to apply the construction that does not contain Al at the interface between the reflector and the active region as in the case of Example 1 to both of the upper and lower reflectors 104 and 109. However, the effect is obtained when using the construction in only one of the reflectors. In Example 1, the semiconductor distributed Bragg reflector is used in both of the upper and lower reflectors 104 and 109. However, it is also possible to form only one of the reflectors by the semiconductor distributed Bragg reflector and form the other reflector by a dielectric reflector. In the abovementioned example, it is further noted that only the layer in the low-refractive index layers forming the reflectors 104 and 109 and located nearest to the active layer 106 has the composition of $Ga_xIn_{1-x}P_yAs_{1-y}$ ($0<x\leq1$, $0<y\leq1$). However, plural $Ga_xIn_{1-x}P_yAs_{1-y}$ ($0<x\leq1$, $0<y\leq1$) layers may be used in the reflectors 104 and 109.

In Example 1, the present invention is applied to the lower reflector 104 between the GaAs substrate 101 and the active layer 106. Because of this, problem of crawling up of the crystal defects caused by Al to the active layer 106, which appears at the time of growth of the active layer 106, and the adversary effects associated therewith are suppressed. As a result, the crystal quality of the active layer 106 is improved and the efficacy of optical emission is improved also. Thereby, a sufficient reliability for practical use is obtained. In view of fact that the $Ga_xIn_{1-x}P_yAs_{1-y}$ ($0<x\leq1$, $0<y\leq1$) layer not containing Al is used not in the entire low-refractive index layers constituting the semiconductor distributed Bragg reflector but at least in the part located close to the active region. Because of this, it is possible to achieve the above-mentioned effect without increasing the number of stacking in the reflector.

The vertical-cavity, surface-emission-type laser diode thus fabricated oscillates at the wavelength of was about 1.2 µm. In a GaInAs layer formed on a GaAs substrate, there occurs increase of wavelength as a result of increase of the In content. However, such an increase of In content is accompanied with increase of strain. Thus, it has been thought that the wavelength of 1.1 µm would be the upper limit. Reference should be made to IEEE Photonics Technol. Lett. Vol. 9 (1997), pp. 1319-1321. In the present invention, it becomes possible to grow the GaInAs quantum-well active layer accumulating a large strain coherently with a thickness not possible hitherto, by using a highly non-equilibrium process such as a low-temperature growth process conducted at 600° C. or less. As a result, a wavelength of 1.2 µm is realized. It should be noted that a Si semiconductor substrate is transparent at this wavelength. Thus, it becomes possible to achieve optical transmission through the Si substrate in a circuit chip in which an electron device and an optical device are integrated on a common Si substrate. Thus, it becomes possible to construct a vertical-cavity, surface-emission-type laser diode of long wavelength band on a GaAs substrate by using a GaInAs layer having a large In content and associated large compressive strain for the active layer.

While the vertical-cavity, surface-emission-type laser diode of FIG. 9 can be grown by an MOCVD process, the same can be grown also by an MBE process. In Example 1, the example of triple quantum well structure (TQW) was shown as the layered structure of the active layer 106. However, I is also possible to use a structure (SQW, MQW) in which the number of the wells used the quantum well is different. Further, the laser diode may have a different structure. While the resonator in Example 1 has a thickness of λ, it is also possible to use the thickness of integer multiple of λ/2, preferably an integer multiple of λ. In Example 1, GaAs was used for the semiconductor substrate 101. However, the present invention is applicable also to the case in which other semiconductor substrate such as InP is used. Further, the repetition period of the reflectors 104 and 109 may be changed to other repetition period.

In example 1, GaInAs was used for the active layer 106. However, GaInNAs can be used in place thereof. In this case, the vertical-cavity, surface-emission-type laser diode of longer wavelength of 1.3 µm band or 1.55 µm band or longer becomes possible by changing the composition of the GaInNAs active layer. Also, the vertical-cavity, surface-emission-type laser diode of the 1.3 µm band can be realized on the GaAs substrate 101 by using GaAsSb for the active layer 106. Conventionally, there has been no material suitable for a laser diode of 1.1-1.3 µm wavelength band. By using a highly strained GaInAs, GaInNAs or GaAsSb layer formed on the GaAs substrate 101, a laser diode of 1.1-1.3 µm wavelength band becomes possible. By using a material system capable of crystal growth on a GaAs substrate 101, a highly efficient vertical-cavity, surface-emission-type laser diode operable at the wavelength band of 1.3 µm or 1.55 µm or longer wavelength, which has hitherto been difficult to realize, is successfully realized.

Example 2

Figures 10A, 10B:
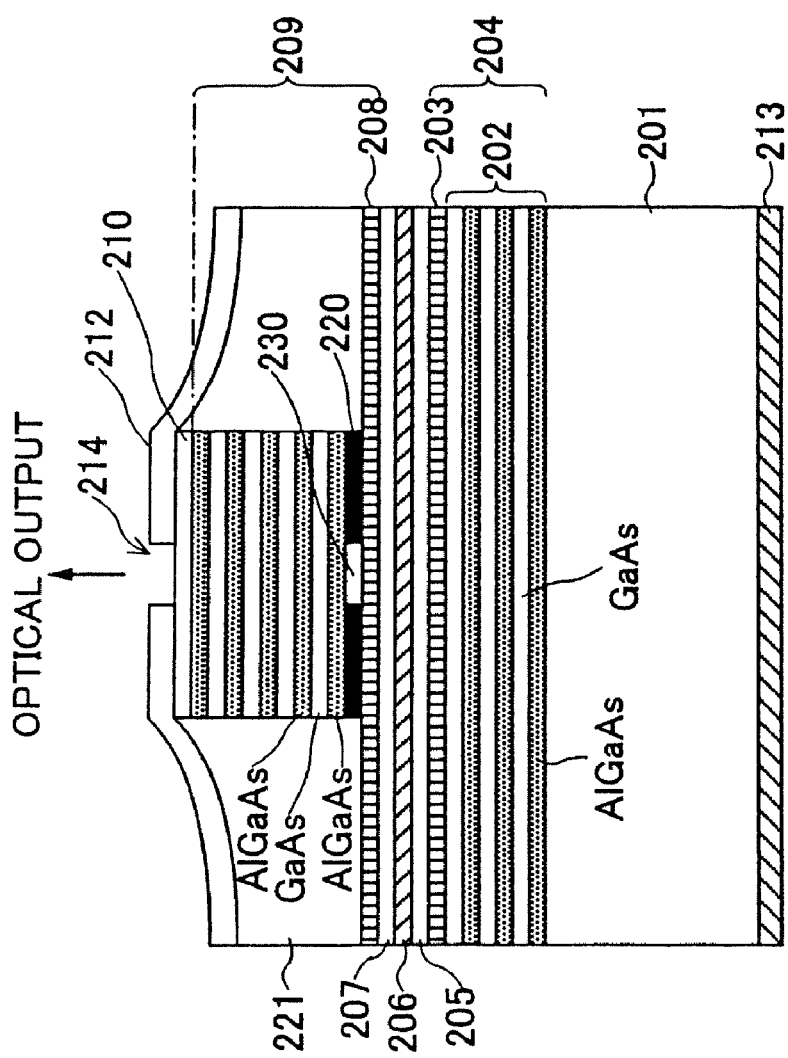
FIGS. 10A and 10B are diagrams showing the construction of a vertical-cavity, surface-emission-type laser diode of Example 2.

FIGS. 10A and 10B show the constitutional example of a vertical-cavity, surface-emission-type laser diode according to Example 2, wherein FIG. 10B is an enlarged view of the active region of FIG. 10A. The vertical-cavity, surface-emission-type laser diode of FIGS. 10A and 10B is formed on n-GaAs substrate 201 having a surface orientation of (100) and includes an n-semiconductor distributed Bragg reflector ($Al_{0.9}Ga_{0.1}As/GaAs$ lower reflector) 204 formed on the substrate 201, wherein the n-semiconductor distributed Bragg reflector 204 includes alternate lamination of an $n-Al_xGa_{1-x}As$ (x=0.9) layer and an $n-Al_xGa_{1-x}As$ (x=0) layer repeated for 35 periods with respective thicknesses of ¼ times the oscillation wavelength (λ) as measured in each media. Further, an $n-Ga_xIn_{1-x}P_yAs_{1-y}$ (x=0.5, y=1) layer (non-optical recombination elimination layer) 203 having a thickness of λ/4 is laminated thereon. In Example 2, the $n-Ga_xIn_{1-x}P_yAs_{1-y}$ (x=0.5, y=1) layer 203 is a low-refractive index layer and forms a part of the lower reflector 204.

Further, a lower GaAs spacer layer 205 is formed on the lower reflector 204, and a multiple quantum-well active layer 206 (triple quantum well (TQW) in Example 2) is formed on the lower GaAs spacer layer 205, wherein the triple quantum well active layer 206 consists of three undoped $Ga_xIn_{1-x}N_yAs_{1-y}$ quantum well layers 206a acting as an active layer (quantum-well active layer) and corresponding GaAs barrier layers 206b (15 nm). Further, an undoped upper GaAs spacer layer 207 is laminated thereon. As a result, an optical cavity having a thickness of one wavelength of the oscillation wavelength as measured in the media (thickness of λ) is formed.

Further, a p-semiconductor distributed Bragg reflector (the upper reflector) 209 is formed on the multiple quantum-well active layer 206. The upper reflector 209 includes a low-refractive index layer of the thickness of 3λ/4, wherein the low-refractive index layer includes an AlAs layer 230 that becomes a selectively oxidized layer such that the AlAs layer 230 is sandwiched by a GaInP layer 208 and an AlGaAs layer. The GaInP layer 208 is formed of a C-doped $p-Ga_xIn_{1-x}P_yAs_{1-y}$ (x=0.5, y=1) layer (non-optical recombination elimination layer) having a thickness of λ/4-15 nm, while the AlGaAs layer is formed of a C-doped p-$Al_xGa_{1-x}As$ layer (x=0.9) having a thickness of 2λ/4-15 nm. Further, a C-doped p-$Al_zGa_{1-z}As$ (z=1) is provided for the selectively oxidized layer 203 with a thickness of 30 nm. On the low-refractive index layer thus formed, a GaAs layer having a thickness of λ/4 is laminated for one period, and a C-doped p-$Al_xGa_{1-x}As$ layer (x=0.9) and a p-$Al_xGa_{1-x}As$ (x=0) layer are formed on the GaAs layer alternately for 22 periods with respective thicknesses of ¼ times the oscillation wavelength as measured in each medium. Thus, a semiconductor distributed Bragg reflector of $Al_{0.9}Ga_{0.1}As$/GaAs structure is formed as the upper reflector 209.

Further, an uppermost layer 210 of p-$Al_xGa_{1-x}As$ (x=0) is formed thereon, wherein the uppermost layer 210 functions as a contact layer (p-contact layer) that makes a contact with a p-side electrode 212.

Here, it should be noted that the In content x of the quantum-well active layer 206a is made to 37% and the N (nitrogen) content of the quantum-well active layer 206a is made to 0.5%. Further, the thickness of the quantum-well active layer 206a is made to 7 nm. In the present Example 2, the growth of the vertical-cavity, surface-emission-type laser diode was conducted by an MOCVD process. Thereby, DMHy (dimethyl hydrazine) was used for the source material of nitrogen, together with the source materials of TMA (trimethyl aluminum), TMG (trimethyl gallium), TMI (trimethyl indium), $AsH_3$ (arsine), or $PH_3$ (phosphine). It should be noted that DMHy decomposes at low temperature. Thus, the material is particularly suitable for low-temperature growth at 600° C. or less, and hence to the growth of highly strained quantum well layer that requires a growth at low-temperatures. In Example 2, $H_2$ was used for the carrier gas. In Example 2, the GaInNAs layer (quantum-well active layer) 206a was grown at 540° C. In view of the fact that high degree of saturation is realized, an MOCVD process is thought suitable for crystal growth of material layers that contain N in addition to other group V elements. Further, there is an advantage that an MOCVD process does not require high vacuum environment contrary to the case of an MBE process. As the growth process can be conducted by merely controlling the flow rate and supply time of the source gases, an MOCVD process is particularly suitable for mass production of semiconductor devices.

In Example 2, the mesa structure of a predetermined size is formed by an etching process until the p-$Ga_xIn_{1-x}P_yAs_{1-y}$ (x=0.5, y=1) layer 208 is reached and the sidewall surface of the p-$Al_zGa_{1-z}As$ (z=1) selectively oxidized layer 230 is exposed. The $Al_zGa_{1-z}As$ (z=1) layer 230 having the sidewall surface thus exposed is then oxidized by water vapor, starting from the sidewall surface, and there is formed an $Al_xO_y$ current confinement part 220 as a result of the oxidation process. Next, the etched region is buried with a polyimide insulation film 221 for planarization, and the polyimide film covering the upper reflector 209 is removed. Further, a p-side electrode 212 is formed on the p-contact layer 210 except for an optical beam exit region 214, and an n-side electrode 213 is formed to the rear surface of the GaAs substrate 201.

In Example 2, the $Ga_xIn_{1-x}P_yAs_{1-y}$ ($0<x\leq1$, $0<y\leq1$) layer 208 is provided under the selectively oxidized layer 230 as a part of the upper reflector 209. Thereby, the $Ga_xIn_{1-x}P_yAs_{1-y}$ ($0<x\leq1$, $0<y\leq1$) layer 208 functions as an etching stopper, provided that sulfuric acid etchant is used in the etching process to form the mesa structure. It should be noted that the material of the GaInPAs system functions as an etching stopper with regard to the material of the AlGaAs system. By inserting the $Ga_xIn_{1-x}P_yAs_{1-y}$ ($0<x\leq1$, $0<y\leq1$) layer 208, the height of the mesa structure used for the selective oxidation process is controlled exactly. Because of this, homogeneity and reproducibility are improved for the laser diode. Further, the cost is reduced also.

By using the vertical-cavity, surface-emission-type laser diode of Example 2 to form a one-dimensional or two-dimensional array, the process control during the device fabrication process is improved, together with improvement of homogeneity and reproducibility of device characteristics between the elements within the array.

In Example 2, the $Ga_xIn_{1-x}P_yAs_{1-y}$ ($0<x\leq1$, $0<y\leq1$) layer 208 that doubles acting also as an etching stopper layer, was provided on the side of the upper reflector 209. However, the layer 208 may be provided on the side of the lower reflector 204.

In Example 2, the material containing Al was not used in the active region (optical cavity consisting of the upper spacer layer 207, the lower spacer layer 205 and the multiple quantum-well active layer 206 in Example 2) that is sandwiched between the upper and lower reflectors 204 and 209 and causing recombination of carriers injected thereto. Further, the low-refractive index layer in the lower reflector 204 and the upper reflector 209 located closest to the active layer is $Ga_xIn_{1-x}P_yAs_{1-y}$ ($0<x\leq1$, $0<y\leq1$). Thus, Al is not contained in the active region or in the interface region between the active region and the reflector in Example 2. Because of this, the problem of non-optical recombination caused by crystal defects originating from Al is reduced even when carrier injection is made. In view of the object of the present invention, it is preferable to form the active region from a layer not containing Al.

As set forth in Example 2, it is preferable to use the construction of eliminating Al from the interface between the reflector and the active region for both of the upper and lower reflectors 204 and 209. However, the use of such a construction to only one of the reflectors is also effective. In example 2, it is also noted that both of the upper and lower reflectors 204 and 209 are formed of the semiconductor distributed Bragg reflector. However, it is possible that only one of the reflectors is formed of the semiconductor distributed Bragg reflector. In this case, the other reflector may be formed of a dielectric reflector.

In example 2, it should be noted that the present invention is applied to the lower reflector 204 located between the GaAs substrate 201 and the active layer 206. Because of this, the problem of crawling up of crystal defects originating from Al to the active layer 206 at the time of growth of the active layer 206 and associated various adversary effects are suppressed. Because of this, the active layer 206 can be grown with high crystal quality, and the efficacy of optical emission in the vertical-cavity, surface-emission-type laser diode is improved. Associated therewith, a reliability sufficient for practical use is achieved for the laser diode. In view of the construction of Example 2 in which not the entire low-refractive index layers in the semiconductor distributed Bragg reflectors 204 and 209 are formed of the Al-free $Ga_xIn_{1-x}P_yAs_{1-y}$ ($0\leq x\leq 1$, $0\leq y\leq 1$) layer but the $Ga_xIn_{1-x}P_yAs_{1-y}$ ($0<x\leq1$, $0<y\leq1$) layer is used only for the layers 203 and 208 located closest to the active region, it becomes possible to obtain the above-mentioned effect without increasing the number of stacking of the reflector. Because of this, planarization process by using the polyimide layer can be achieved easily. Associated therewith, the problem of interconnection pattern (p-side electrode 212 in Example 2) being discontinued at a stepped part is successfully avoided, and there occurred no degradation in the yield device production.

The vertical-cavity, surface-emission-type laser diode thus produced oscillated at the wavelength of was about 1.3 μm. As a result of use of GaInNAs in the active layer 206 in Example 2, it became possible to form a vertical-cavity, surface-emission-type laser diode operable at a long wavelength band on the GaAs substrate 201. Further, as a result of formation of the current confinement structure by selective oxidation of the selectively oxidized layer 230 that contains Al and As as the principal component, it becomes possible to reduce the threshold current. By using the current confinement structure that uses the current confinement part 220 of Al oxide formed by selective oxidation of the selectively oxidized layer 230, the current confinement part 220 can be formed closer to the active layer 206 and the spreading of the electric current is suppressed. Thus, the carriers are confined efficiency into a minute region not exposed to the atmosphere. Further, the Al oxide film formed as a result of oxidation process is characterized by a small refractive index. Because of this, the optical beam is confined efficiently by a convex lens effect into the minute region in which the carriers are confined. Thereby, the efficiency of the vertical-cavity, surface-emission-type laser diode is improved further and the threshold current is reduced further. According to Experiment 2, it should be noted that the current confinement structure can be formed easily. Because of this, the fabrication cost of the laser diode is reduced. Thus, according to Example 2, a low-cost vertical-cavity, surface-emission-type laser diode of the 1.3 μm band having a reduced electric power consumption is provided.

The vertical-cavity, surface-emission-type laser diode of FIG. 10 can be grown by the MOCVD process as noted before. However, it is also possible to grow the laser diode by other process such as MBE process. Further, it is noted that DMHy is used as the source material of nitrogen in Example 2. However, other nitrogen compound such as activated nitrogen or $NH_3$ can also be used. In Example 2, a triple quantum well structure (TQW) was shown as the layered structure of the active layer 206. However, it is possible to use a structure (SQW, DQW, MQW) in which the number of the wells used the quantum well is different from the triple quantum well structure. Further, it is possible to use a different laser diode structure.

In the vertical-cavity, surface-emission-type laser diode of FIG. 10, operation at a longer wavelength such as 1.55 μm band or more becomes possible by adjusting the composition of the GaInNAs active layer 206a. Further, it should be noted that the GaInNAs active layer 206a may contain other III-V elements such as Tl, Sb, P etc. Further, it is possible that the vertical-cavity, surface-emission-type laser diode of 1.3 μm band can be realized also on the GaAs substrate 201 by using GaAsSb for the active layer 206a. In the case of using GaInAs for the active layer 206a, it is possible to grow a highly strained GaInAs quantum-well active layer with a large thickness not possible hitherto by using a low-temperature growth of 600° C. or less similarly as before. Thereby, an oscillation wavelength of 1.2 μm can be attained, while this wavelength is longer than the wavelength of 1.1 μm, which was hitherto thought as being the limit. Conventionally, no suitable material has been known for realizing a laser diode operable at the wavelength of 1.1-1.3 μm. By using highly strained GaInAs, GaInNAs or GaAsSb, a laser diode operable at the wavelength of 1.1-1.3 μm band becomes possible. Further, it becomes possible to realize a highly efficient vertical-cavity, surface-emission-type laser diode operable at long wavelength of the 1.3 μm band or 1.55 μm band, in which wavelength band, it has hitherto been difficult to operate the laser diode with high performance.

Example 3

Figure 11:
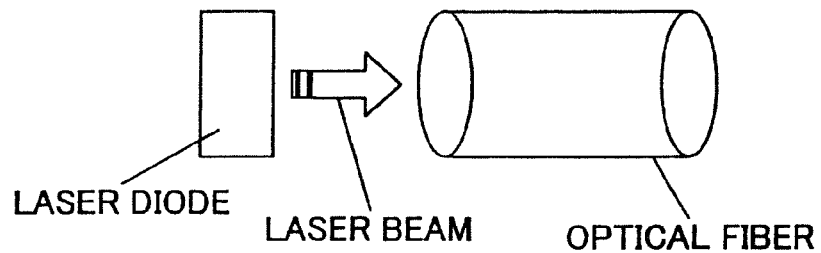
FIG. 11 is a diagram showing the overall construction of an optical transmission module that combines a 1.3 μm band GaInNAs vertical-cavity, surface-emission-type laser diode of Example 2 and a quartz optical fiber.

Example 3 relates to an optical transmission module. FIG. 11 shows the general construction of the optical transmission module in which a quartz optical fiber is coupled with a 1.3 μm band GaInNAs vertical-cavity, surface-emission-type laser diode of Example 2. Referring to FIG. 11, the optical signal (laser beam) is injected into the optical fiber from the laser diode, and the optical signal thus injected is transmitted along the optical fiber. Thereby, the transmission rate can be increased by using a wavelength multiple transmission technique that uses a plurality of laser diodes having different oscillation wavelengths configured in one-dimensional or two-dimensional array. Further, it is possible to increase the transmission rate I by using an optical fiber bundle consisting of a plurality of optical fibers corresponding to each laser diode forming a one-dimensional or two-dimensional array together with other laser diodes.

By using the vertical-cavity, surface-emission-type laser diode of the present invention in the optical telecommunication system, the cost of the optical telecommunication system that uses an optical transmission module, in which a transmitter laser diode and an optical fiber are coupled, is reduced substantially, in view of the low cost of the vertical-cavity surface-emission type laser diode of the present invention. In view of the fact that the temperature characteristics of the GaInNAs vertical-cavity surface-emission type laser diode is excellent and in view of the laser diode is characterized by low threshold of laser oscillation, the heat generation associated with operation of the laser diode is reduced and the system can be used without cooling up to high temperatures. Further, it is possible to couple the GaInNAs vertical-cavity, surface-emission-type laser diode with a fluorine added POF (plastics optical fiber) that shows a low optical loss at the wavelength longer than the 1.3 μm band. In this case, the optical fiber is low cost and the diameter of the optical fiber is large enough for facilitating optical coupling. Thus, the mounting cost is reduced and the optical module can be realized with extremely low cost.

Example 4

Figure 12:
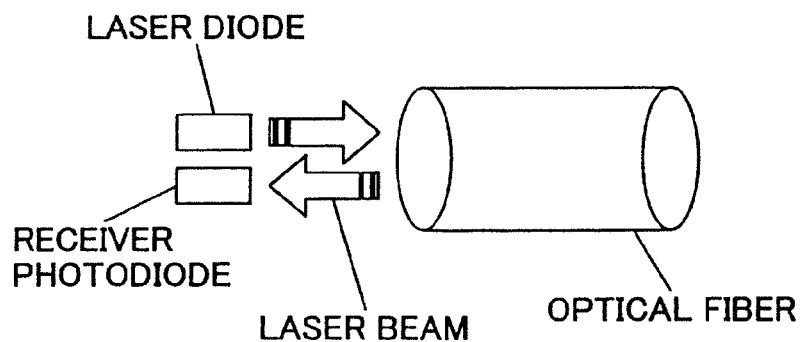
FIG. 12 is a diagram showing the overall construction of an optical transceiver module that combines a 1.3 μm band GaInNAs vertical-cavity, surface-emission-type laser diode of Example 2 and a receiver photodiode with an optical fiber.

Example 4 is related to an optical transceiver module. FIG. 12 shows the general construction of the optical transceiver module, in which the 1.3 μm band GaInNAs vertical-cavity, surface-emission-type laser diode of Example 2 and a receiver photodiode are coupled with an optical fiber of example 2.

By using the vertical-cavity, surface-emission-type laser diode of the present invention in the optical telecommunication system, the cost of the optical telecommunication system that uses an optical transceiver module, in which a transmitter laser diode, a receiver photodetector and an optical fiber are coupled, is reduced substantially, in view of the low cost of the vertical-cavity surface-emission type laser diode of the present invention. In view of the fact that the temperature characteristics of the GaInNAs vertical-cavity surface-emission type laser diode is excellent and in view of the fact that the laser diode is characterized by low threshold of laser oscillation, the heat generation associated with operation of the laser diode is reduced and the system can be used without cooling up to high temperatures. Further, it is possible to couple the GaInNAs vertical-cavity, surface-emission-type laser diode with a fluorine added POF (plastics optical fiber) that shows a low optical loss at the wavelength longer than the 1.3 μm band. In this case, the optical fiber is low cost and the diameter of the optical fiber is large enough for facilitating optical coupling. Thus, the mounting cost is reduced and the optical module can be realized with extremely low cost.

It should be noted that the optical telecommunication system that uses the vertical-cavity, surface-emission-type laser diode of the present invention is by no means limited to a long-distance telecommunication system that uses an optical fiber. For example, the optical telecommunication system of the present invention is applicable to short-distance telecommunication including device-to-device data exchange in computers and local area networks (LAN). Furthermore, the present invention is applicable to data exchange between large-scale integrated circuits or inside a large-scale integrated circuit. Further, the present invention is applicable to data exchange between printed circuit boards. In recent years, the processing performance of large-scale integrated circuits has been improved remarkably. Thus, the transmission rate in the part connecting large-scale integrated circuits is becoming a bottleneck of overall system performance. Thus, by replacing the conventional electric interconnection by optical signal interconnection inside a system by way of using optical transmission modules or optical transceiver modules, examples of which may be device-to-device optical interconnection inside a large-scale integrated circuit, optical interconnection between large-scale integrated circuits in a circuit board, or optical interconnection between circuit boards in a computer system, a ultrahigh speed computer system becomes possible. Further, a ultrahigh speed network system is realized when a plurality of computer systems, and the like, are interconnected by using the above-mentioned optical transmission modules or optical transceiver modules.

Especially, a vertical-cavity, surface-emission-type laser diode consumes incommensurably small electric power as compared with an edge-emission type laser diode and is particularly suited for constructing a two-dimensional array. Because of this, the laser diode is suitable for constructing a parallel optical telecommunication system.

Example 5

In Example 5, a vertical-cavity, surface-emission-type laser diode is provided having a construction similar to that of the laser diode of Example 2 except that the $Ga_xIn_{1-x}P_yAs_{1-y}$ ($0<x\leq1$, $0<y\leq1$) layers 203 and 208 in the constitution of FIGS. 10A and 10B acting as a non-optical recombination elimination layer has a composition of $Ga_xIn_{1-x}P_yAs_{1-y}$ (x=0.55, y=0).

Thus, in the vertical-cavity, surface-emission-type laser diode of Example 5, the $Ga_xIn_{1-x}P_yAs_{1-y}$ ($0<x\leq1$, $0<y\leq1$) layers 203 and 208 accumulate therein a strain. Because of this, there is achieved an effect, in addition to the effect of Example 2, to suppress the crawling up of the defects existing in the substrate or formed during the growth process, at least partially at the time of growth of the epitaxial layers. As a result, the efficacy of optical emission is improved substantially. Further, even in the case the crystal quality of the n-side multilayer reflector (lower reflector) 204 is moderate, it was possible to grow an active layer having a large strain easily. Thus, in this example, it is possible to grow an active layer accumulating a compressive strain of 2% or more. Further, it becomes possible to grow a strained layer with a thickness exceeding the critical thickness.

It should be noted that the $Ga_xIn_{1-x}P_yAs_{1-y}$ ($0<x\leq1$, $0<y\leq1$) layers 203 and 208 make a contact with the active region. In view of the fact that there occurs an increase of bandgap energy with decrease of lattice constant in the $Ga_xIn_{1-x}P_yAs_{1-y}$ ($0<x\leq1$, $0<y\leq1$) layers 203 and 208, the height of the hetero barrier formed between the active region and the $Ga_xIn_{1-x}P_yAs_{1-y}$ ($0<x\leq1$, $0<y\leq1$) is increased. As a result, the efficiency of carrier confinement is improved and the threshold current is reduced. Thereby, the temperature characteristics are improved. More specifically, in Example 5, the bandgap became larger by about 70 meV as compared with the device of Example 2 ($Ga_{0.5}In_{0.5}P$).

Example 6

In Example 6, the vertical-cavity, surface-emission-type laser diode is different from the device of Example 2 in the point that the $Ga_xIn_{1-x}P_yAs_{1-y}$ ($0<x\leq1$, $0<y\leq1$) layers 203 and 208 acting as a non-optical recombination elimination layer in the construction of FIGS. 10A and 10B are formed of $Ga_xIn_{1-x}P_yAs_{1-y}$ (x=0.45, y=1).

Thus, in the vertical-cavity, surface-emission-type laser diode of Example 6, the $Ga_xIn_{1-x}P_yAs_{1-y}$ ($0<x\leq1$, $0<y\leq1$) layers 203 and 208 accumulate therein a strain. Because of this, there is achieved an effect, in addition to the effect of Example 2, to suppress the crawling up of the defects existing in the substrate or formed during the growth process, at least partially at the time of growth of the epitaxial layers. As a result, the efficacy of optical emission is improved substantially. Further, even in the case the crystal quality of the n-side multilayer reflector (lower reflector) 204 is moderate, it was possible to grow an active layer having a large strain easily. Thus, in this example, it is possible to grow an active layer accumulating a compressive strain of 2% or more. Further, it becomes possible to grow a strained layer with a thickness exceeding the critical thickness.

Furthermore, in Example 6, it should be noted that the sense of the strain in the $Ga_xIn_{1-x}P_yAs_{1-y}$ ($0<x\leq1$, $0<y\leq1$) layers 203 and 208 is the same as the sense of the strain in the active layer 206a. Because of this, one obtains an advantageous effect in that the actual compressive strain that the active layer 206a senses is reduced, in addition to the effect that the strained layer is inserted. Because of this, the influence of the defects existing on the surface of the foundation layer in the state immediately before the growth of the active layer is reduced. As a result, the active layer was grown with improved quality and the characteristics of the laser diode were improved.

It turned out that the present invention is particularly effective in the case of the vertical-cavity, surface-emission-type laser diode of long wavelength band that requires a thick film growth process. For example, in the case of the 1.3 μm band GaInNAs vertical-cavity, surface-emission-type laser diode formed on a GaAs substrate, it is necessary to grow 50-80 semiconductor layers with a total thickness of 5-8 μm before the growth of the active layer, in view of the use of the semiconductor multilayer reflector for the optical cavity. In the case of an edge-emission type laser diode, on the contrary, the total thickness before the growth of the active layer is about 2 μm. In this case, it is sufficient to grow only about three semiconductor layers. In the case of the vertical-cavity, surface-emission-type laser diode of such a long wavelength band, the defect density of the foundation layer surface, on which the growth of the active layer is made, increases inevitably in the state immediately before the growth of the active layer, as compared with the defect density of the GaAs substrate surface by various reasons, even in the case a GaAs substrate of high quality is used. (It should be noted that the defect once occurred generally crawls up in the direction of crystal growth. Further, there can be defect formation, and the like, at the hetero interface.) By reducing the actual compressive strain that the active layer senses or by inserting a strained layer before the growth of the active layer, the adversary influence caused by the defects existing on the foundation layer surface immediately before the growth of the active layer is reduced. Because of this, it becomes possible to conduct a thick film growth such as the one used in the vertical-cavity, surface-emission-type laser diode, easily with high crystal quality.

Example 7

Figure 20A:
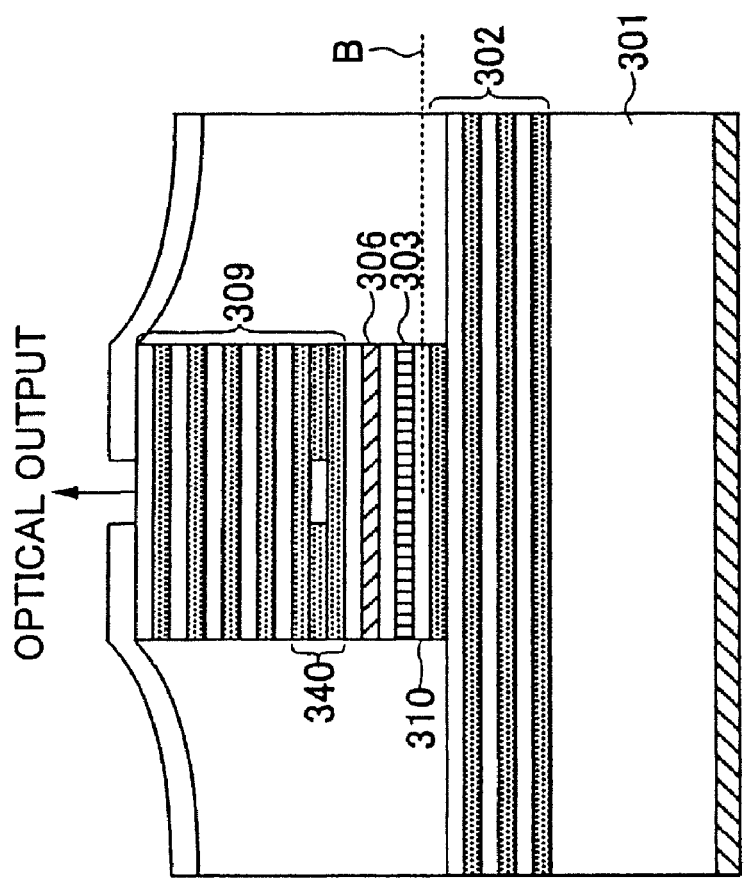
FIGS. 20A and 20B are diagrams showing the construction of vertical-cavity, surface-emission-type laser diode of Example 7.
Figure 20B:
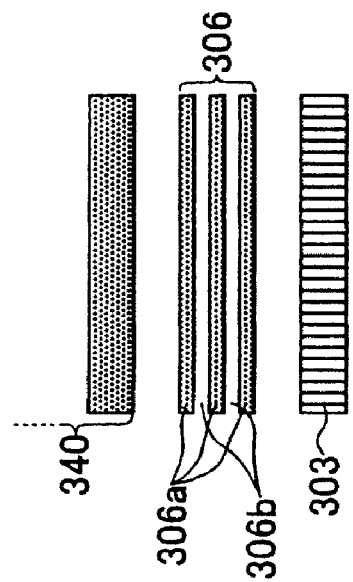

FIGS. 20A and 20B show the construction of a vertical-cavity, surface-emission-type laser diode according to Example 7, wherein FIG. 20B shows an enlarged view of the active region of FIG. 20A.

Referring to FIGS. 20A and 20B, the vertical-cavity, surface-emission-type laser diode of Example 7 is formed on an n-GaAs substrate 301 and includes a lower reflector 302, a non-optical recombination elimination layer 303, a multiple quantum-well active layer 306, and an upper reflector 309 laminated consecutively on the GaAs substrate 301. Here, the lower reflector 302 is formed by alternate lamination of an n-$Al_xGa_{1-x}As$ (x=0.9) layer and an n-$Al_xGa_{1-x}As$ (x=0) layer. Further, the multiple quantum-well active layer 306 is formed of three active layers each formed of a $Ga_xIn_{1-x}N_yAs_{1-y}$ quantum well layer (quantum-well active layer) 306a and corresponding GaAs barrier layers 306b. In other words, in the vertical-cavity, surface-emission-type laser diode of Example 7, the lower reflector 302 contains Al, while the active layer 306 contains nitrogen. In FIGS. 20A and 20b, the reference numeral 340 designates a low-refractive index layer having the thickness of 3λ/4.

In the production of the vertical-cavity, surface-emission-type laser diode of FIGS. 20A and 20B, the crystal growth was conducted by an MOCVD process. Thereby, TMA was used as the Al source material when growing a layer containing Al, while DMHy was used as the source material of nitrogen when growing a layer (GaInNAs layer) containing nitrogen.

The difference between the device Example 7 and the device of Example 2 is that the growth of the GaAs layer 310 located underneath the non-optical recombination elimination layer 303 is interrupted midway of growth thereof with (at the part shown with a dashed line B). During the interruption of the growth, the Al source material, Al product, Al compound or Al remaining in the growth chamber where the nitrogen source compound or impurity therein may make a contact therewith is removed by a purging process that uses a hydrogen carrier gas. In Example 7, the purging process was conducted for the duration of 60 minutes. During the interruption of growth in Example 7, the wafer was left in the reaction chamber.

In this way, the Al concentration in the GaInNAs active layer 306 was reduced to $3 \times 10^{17}$ cm$^{-3}$ or less, and the oxygen concentration level in the GaInNAs active layer 306 was reduced to $1 \times 10^{17}$ cm$^{-3}$, or background level. Thereby, the efficacy of optical emission of the active layer 306 containing nitrogen was improved and the threshold current of the device was reduced.

In Example 7, it is noted that the interruption of growth was made during the growth of the GaAs layer 310 located underneath the non-optical recombination elimination layer 303. However, such an interruption growth may be made during the growth of the non-optical recombination elimination layer 303.

In Example 7, the growth of the crystal layer was interrupted and purging of the Al source material, Al product, Al compound or Al was conducted. However, it is also possible to reduce the growth rate without doing interrupting the growth. In this case, the duration between the growth of the layer containing Al and the growth of the layer containing nitrogen is increased, and the purging can be made while continuing the grow process.

In example 7, the upper non-optical recombination elimination layer is not provided unlike the device of Example 2. Further, the non-optical recombination elimination layer is not used as an etching stopper. However, it is as well possible to construct as in the case of Example 2.

Example 8

Figures 21A, 21B:
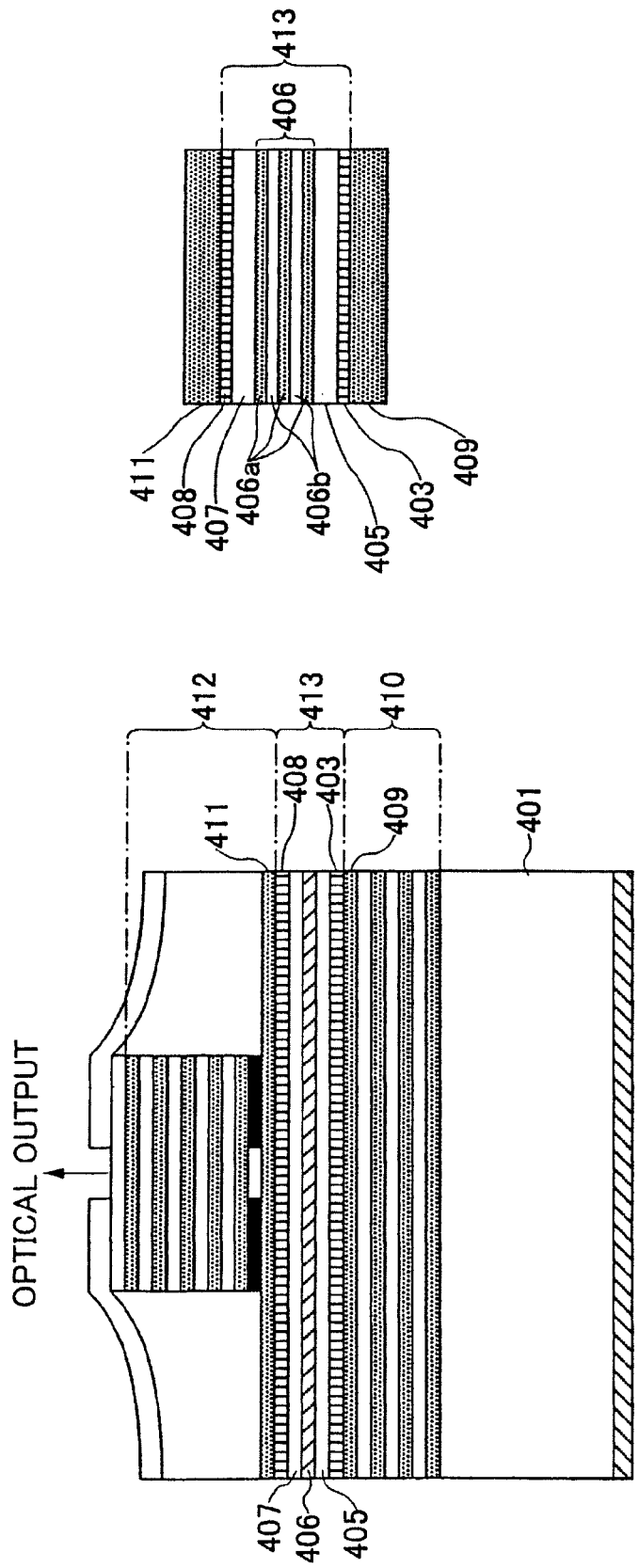
FIGS. 21A and 21B are diagrams showing the construction of a vertical-cavity, surface-emission-type laser diode of Example 8.

FIGS. 21A and 21B show the example of a vertical-cavity, surface-emission-type laser diode according to Example 8, wherein FIG. 21B shows an enlarged view of the active region of FIG. 21A.

Referring to FIGS. 21A and 21B, the vertical-cavity surface-emission type laser diode of Example 8 is formed on a n-GaAs substrate 401 and includes an n-semiconductor distributed Bragg reflector (lower reflector) 410, an optical cavity part 413, and a p-semiconductor distributed Bragg reflector (upper reflector) 412 laminated consecutively on the n-GaAs substrate 401. It should be noted that the uppermost layer of the lower reflector 410 is formed of an AlGaAs low-refractive index layer 409. Further, the lowermost layer of the upper reflector 412 is formed of an AlGaAs low-refractive index layer 411. Further, the optical cavity part 413 is formed of an active layer 406 which in turn is formed of three GaInNAs quantum well layers 406a and corresponding GaAs barrier layers 406b, first GaAs barrier layers 405 and 407, and GaInP non-optical recombination elimination layers (second barrier layer) 403 and 408.

The difference between the vertical-cavity, surface-emission-type laser diode of Example 8 and the device of Example 2 is that the non-optical recombination elimination layers 403 and 408 are formed inside the optical cavity 413. Further, in Example 8, the thickness of the optical cavity 413 is set to one wavelength.

In the structure of FIGS. 21A and 21B, it should be noted that the GaInP non-optical recombination elimination layers (the second barrier layer) 403 and 408 have a bandgap larger than the bandgap of GaAs first barrier layers 405 and 407. Further, the active region in which carrier injected is made extends substantially up to the GaAs first barrier layers 405 and 407. Because of this, the effect similar to the device of Example 2 is obtained.

In the of interrupting the growth the crystal layers like the device of Example 7, it is possible to conduct such an interruption process midway of the growth of lower non-optical recombination elimination layer 403. Alternatively, the interruption may be made during the growth of a GaAs layer is provided between the lower non-optical recombination elimination layer 403 and the layer containing Al (such as the layer 409).

Further, the present invention is not limited to the embodiments described heretofore, but various variations and modifications may be made without departing from the scope of the present invention.

Present invention is based on Japanese patent applications 2000-286477 filed on Sep. 21, 2000, 2001-068588 filed on Mar. 12, 2001 and 2001-214930 filed on Jul. 16, 2001, the entire contents of which are incorporated herein as reference.

What is claimed is:

1. A vertical-cavity, surface-emission-type laser diode comprising:
   a semiconductor substrate; and
   an optical cavity structure provided on or above said semiconductor substrate, said optical-cavity structure comprising an active region containing at least one active layer that produces a laser beam, and upper and lower reflectors sandwiching said active region to form said optical cavity, said lower reflector including a semiconductor distributed Bragg reflector having a refractive index that changes periodically, said lower reflector reflecting an optical beam incident thereto by diffraction, said semiconductor distributed Bragg reflector comprising a low-refractive-index layer of $Al_xGa_{1-x}As$ ($0<x\leq1$) and a high-refractive-index layer of $Al_yGa_{1-y}As$ ($0\leq y<x\leq1$), wherein a $Ga_xIn_{1-x}P_yAs_{1-y}$ ($0<x\leq1$, $0<y\leq1$) layer forms a part of said lower reflector.

2. A vertical-cavity, surface-emission-type laser diode as claimed in claim 1, wherein said $Ga_xIn_{1-x}P_yAs_{1-y}s$ ($0<x\leq1$, $0<y\leq1$) layer forms a low-reflective index layer in said lower reflector.

3. A vertical-cavity, surface-emission-type laser diode as claimed in claim 1, wherein said at least one active layer contains nitrogen therein.

4. A vertical-cavity, surface-emission-type laser diode as claimed in claim 1, wherein said at least one active layer comprises any of GaNAs, GaNPAs, GaInNAs, GaNAsSb and GaInNAsSB.

5. A vertical-cavity, surface-emission-type laser diode as claimed in claim 1, wherein said active layer accumulates a compressive strain of 2.0% or more.

6. A vertical-cavity, surface-emission-type laser diode as claimed in claim 1, wherein a part between said active layer and said upper reflector is free from GaInPAs.

* * * * *